(12) United States Patent
Miyoshi et al.

(10) Patent No.: US 8,984,454 B2
(45) Date of Patent: Mar. 17, 2015

(54) PATTERN DATA GENERATION METHOD, PATTERN VERIFICATION METHOD, AND OPTICAL IMAGE CALCULATION METHOD

(71) Applicant: Kabushiki Kaisha Toshiba, Tokyo (JP)

(72) Inventors: Seiro Miyoshi, Mie (JP); Taiki Kimura, Kanagawa (JP); Hiromitsu Mashita, Kanagawa (JP); Fumiharu Nakajima, Kanagawa (JP); Tetsuaki Matsunawa, Kanagawa (JP); Toshiya Kotani, Tokyo (JP); Chikaaki Kodama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/799,321

(22) Filed: Mar. 13, 2013

(65) Prior Publication Data

US 2014/0059502 A1 Feb. 27, 2014

(30) Foreign Application Priority Data

Aug. 24, 2012 (JP) .................................. 2012-185497

(51) Int. Cl.
  *G06F 17/50* (2006.01)
(52) U.S. Cl.
  CPC ....................................... *G06F 17/50* (2013.01)
  USPC ............................................. 716/55; 716/111
(58) Field of Classification Search
  CPC .................................. G06F 17/50; G06F 9/455
  USPC ..................................................... 716/55, 111
  See application file for complete search history.

(56) References Cited

U.S. PATENT DOCUMENTS

| | | | |
|---|---|---|---|
| 6,954,911 B2 | 10/2005 | Pierrat | |
| 7,111,277 B2 | 9/2006 | Ye et al. | |
| 7,117,477 B2 | 10/2006 | Ye et al. | |
| 7,117,478 B2 | 10/2006 | Ye et al. | |
| 7,600,213 B2 | 10/2009 | Nojima et al. | |
| 7,685,560 B2 * | 3/2010 | Nagatomo et al. | 716/51 |
| 7,840,390 B2 | 11/2010 | Satake et al. | |
| 8,307,310 B2 | 11/2012 | Kotani et al. | |
| 8,413,081 B2 * | 4/2013 | Ye et al. | 716/51 |
| 8,631,359 B1 | 1/2014 | Huang et al. | |
| 8,682,059 B2 | 3/2014 | Cao et al. | |
| 2007/0031745 A1 | 2/2007 | Ye et al. | |
| 2013/0204594 A1 | 8/2013 | Liu | |

FOREIGN PATENT DOCUMENTS

| | | |
|---|---|---|
| JP | 2006-154245 A | 6/2006 |
| JP | 2007-324479 A | 12/2007 |
| JP | 2010-177374 A | 8/2010 |
| JP | 2011-215627 A | 10/2011 |

OTHER PUBLICATIONS

Peng Liu et al. "A full-chip 3D computational lithography framework." Proc. of SPIE vol. 8326, pp. 83260A-1-83260A-18.

\* cited by examiner

*Primary Examiner* — Thuan Do
(74) *Attorney, Agent, or Firm* — Posz Law Group, PLC

(57) ABSTRACT

According to an embodiment, a pattern data generation method is provided. In the pattern data generation method, when a resist on a substrate is exposed using a mask, an optical image at a designated resist film thickness position is calculated using a mask pattern. Feature quantity related to a shape of a resist pattern at the resist film thickness position is extracted, based on the optical image. Also, whether the resist pattern is failed is determined, based on the feature quantity, and pattern data of a mask pattern determined as failed is corrected.

16 Claims, 16 Drawing Sheets

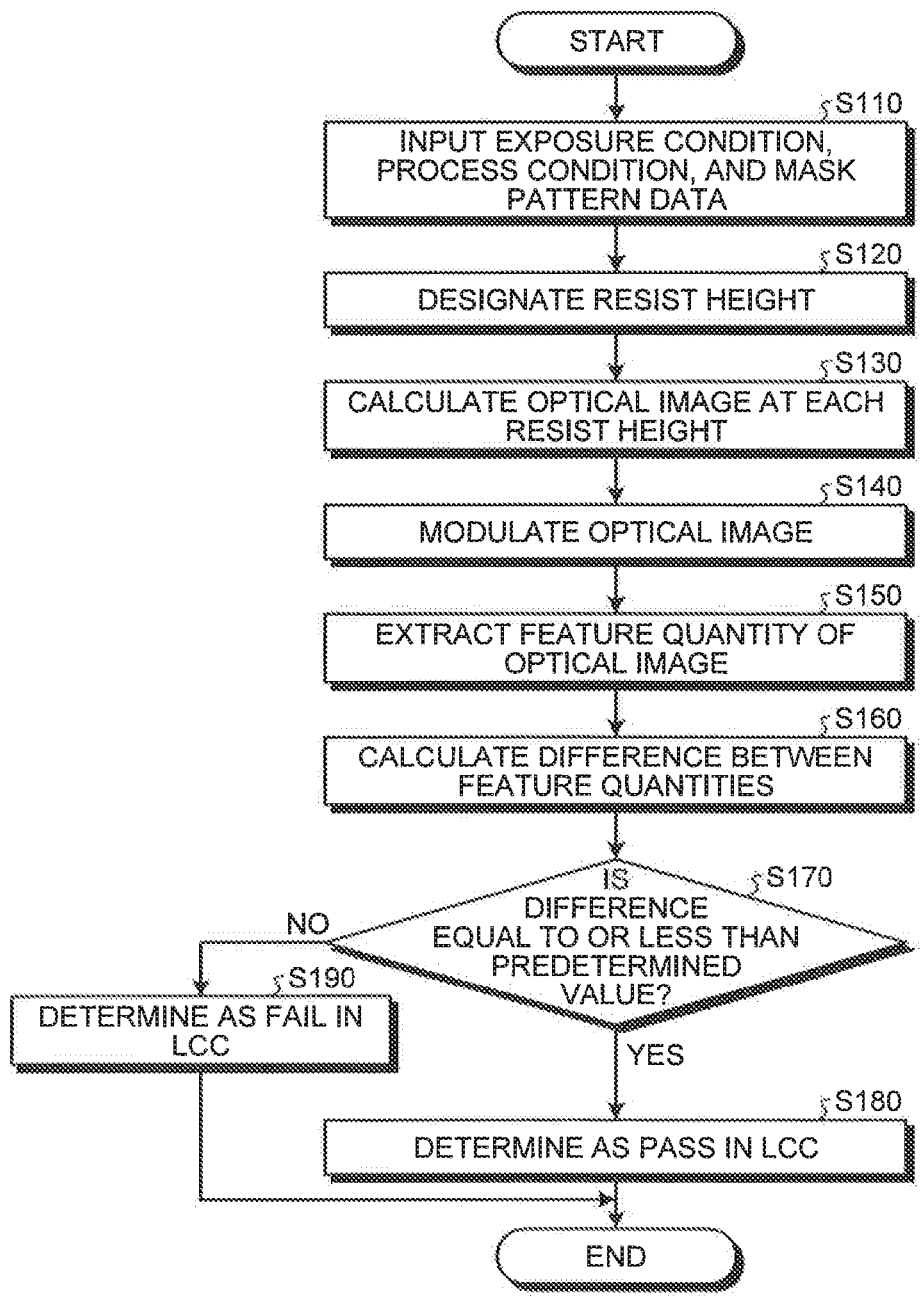

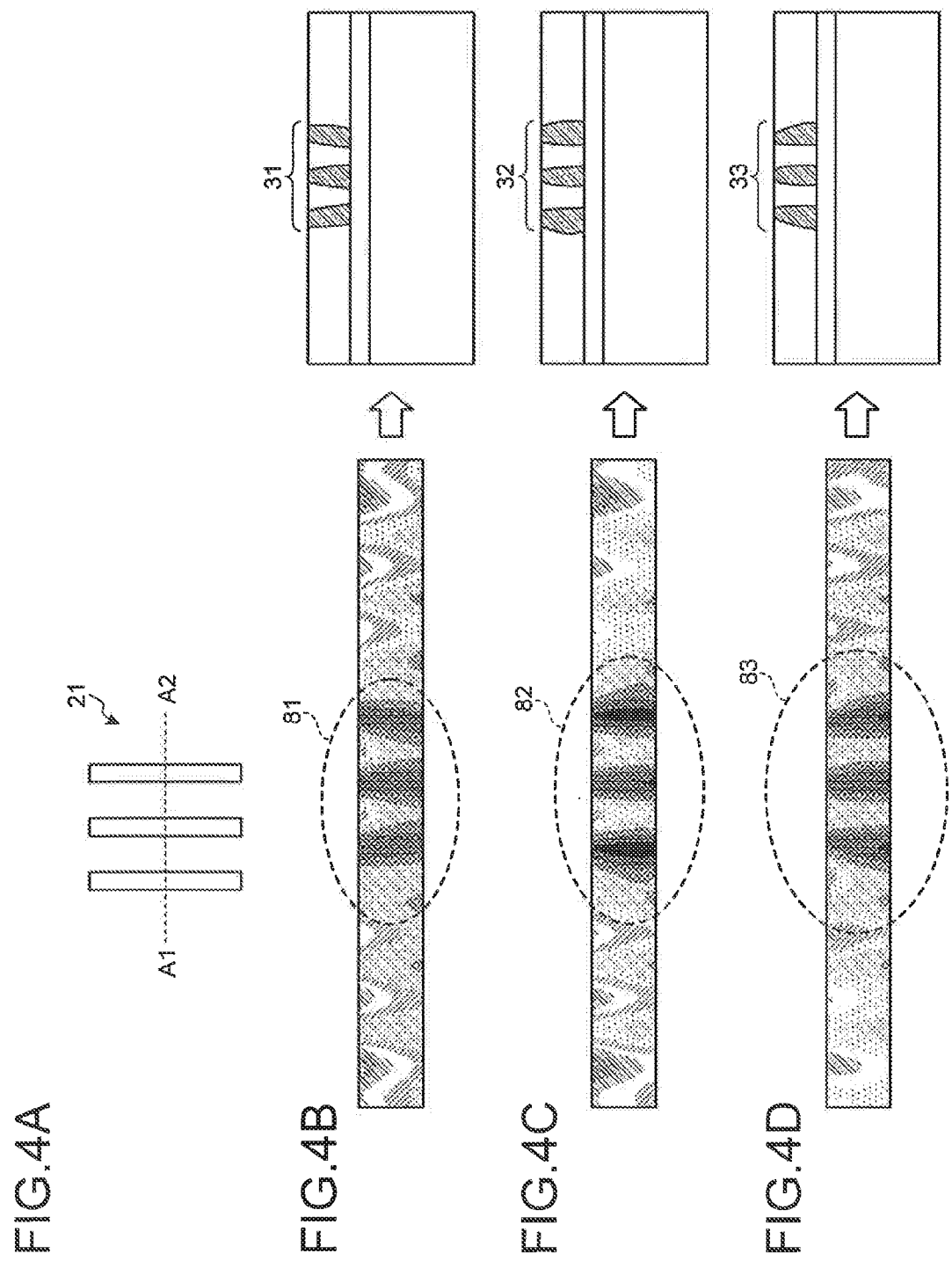

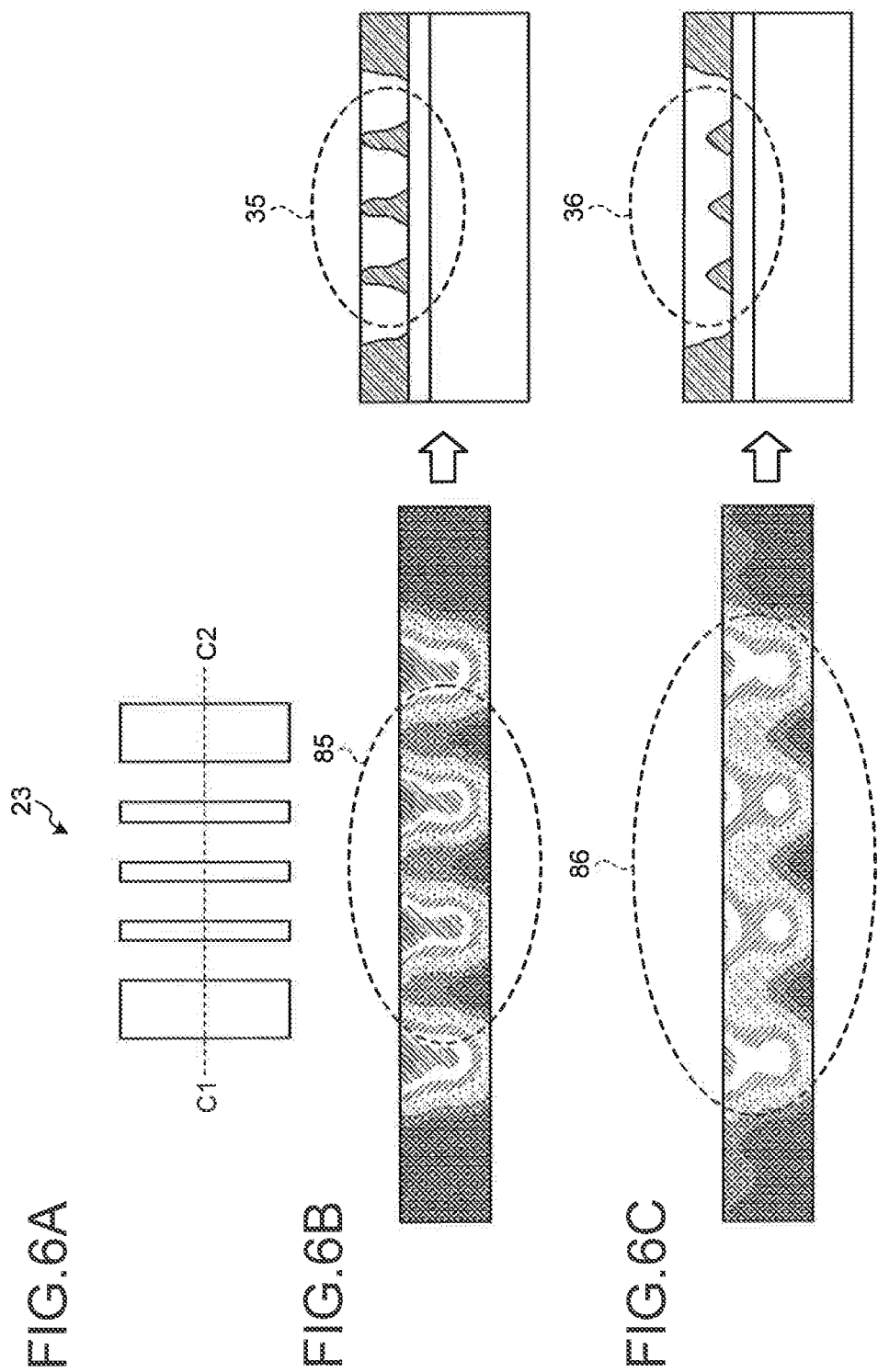

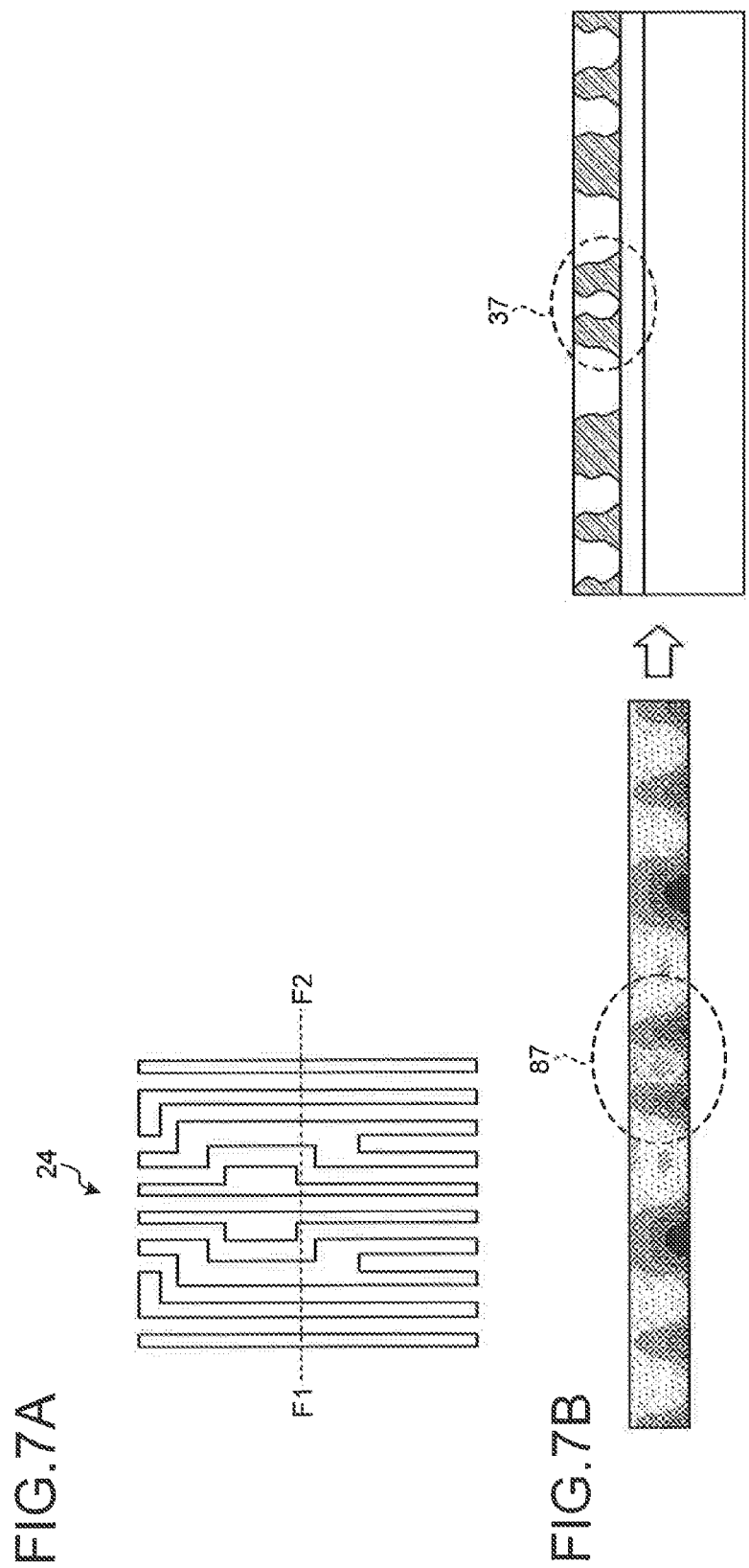

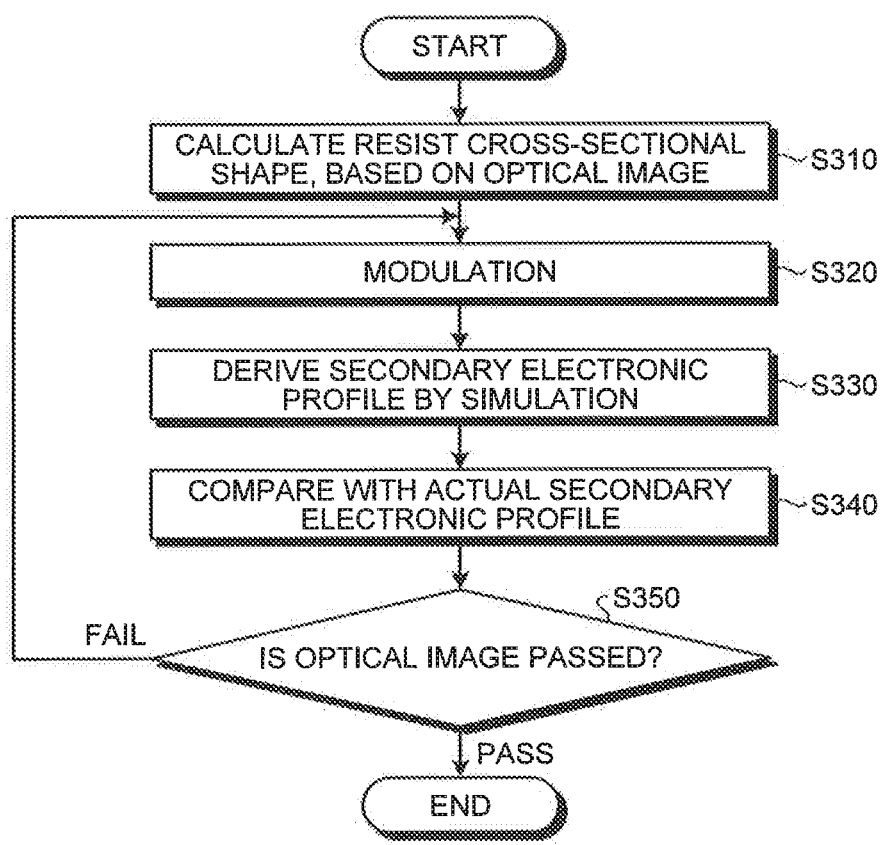

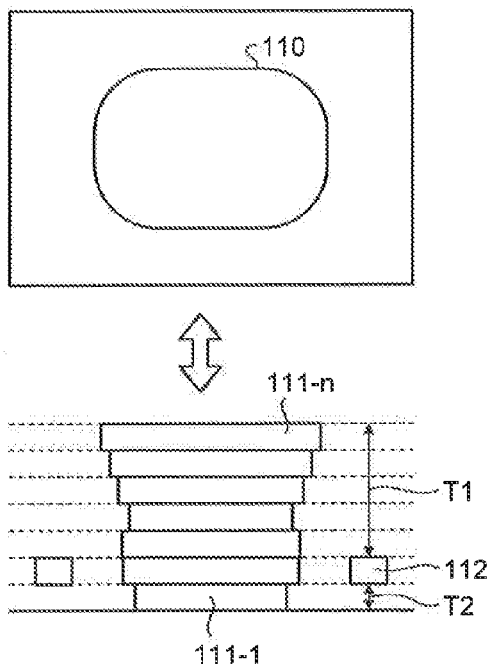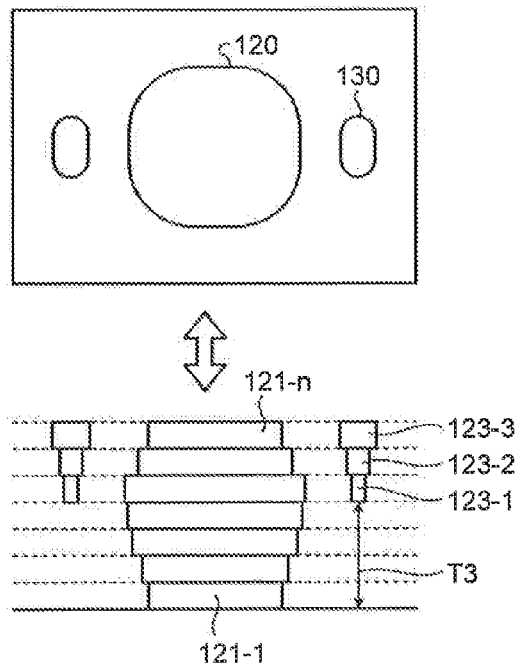

PATTERN DATA GENERATION METHOD, PATTERN VERIFICATION METHOD, AND OPTICAL IMAGE CALCULATION METHOD

CROSS-REFERENCE TO RELATED APPLICATIONS

This application is based upon and claims the benefit of priority from Japanese Patent Application No. 2012-185497, filed on Aug. 24, 2012; the entire contents of which are incorporated herein by reference.

FIELD

Embodiments generally relate to a pattern data generation method, a pattern verification method, and an optical image calculation method.

BACKGROUND

With the miniaturization of semiconductor devices, it is becoming difficult to form resist patterns with sufficient lithography margins. Thus, when manufacturing a photomask, the pass or fail of mask pattern data is verified in advance by a lithography compliance check (LCC) or the like, and a photomask is manufactured using mask pattern data having passed the LCC.

A conventional LCC obtains an optical image within a resist by using mask pattern data, exposure conditions, and process conditions (resist film thickness and the like). At that time, the optical image is averaged in a resist film thickness direction. A dimension of a resist, when viewed from a top surface side of a resist pattern, is derived using the optical image obtained in this way, and the pass or fail of the mask pattern data is determined based on the dimension of the resist.

However, in such an LCC, a slope of a collapsed resist pattern or the like could not be checked. As a result, until the resist pattern is actually formed, poor formation of the resist pattern could not be verified. Therefore, it is desired to accurately determine the quality of the mask pattern data.

BRIEF DESCRIPTION OF THE DRAWINGS

FIG. 3 is a flowchart illustrating a procedure of a process for verifying a pattern of mask pattern data;

FIGS. 4A to 4D are diagrams describing cross-sectional shapes of sloped resist patterns;

FIGS. 6A to 6C are diagrams describing cross-sectional shapes of resist patterns that are film-reduced in a height direction;

FIGS. 7A and 7B are diagrams describing a cross-sectional shape of a resist pattern that generates footing in a bottom portion;

FIG. 20 is a flowchart illustrating a processing procedure of a process for modulating an optical image according to a fifth embodiment;

FIG. 21A is a diagram illustrating shapes of resist patterns when an SRAF is not transferred on a resist; and FIG. 21B is a diagram illustrating shapes of resist patterns when an SRAF is transferred on a resist.

DETAILED DESCRIPTION

According to an embodiment, a pattern data generation method is provided. In the pattern data generation method, when a resist on a substrate is exposed using a mask with a mask pattern, an optical image (aerial image) at a designated resist film thickness position is calculated using pattern data of the mask pattern. Then, feature quantity related to a shape of a resist pattern at the resist film thickness position is extracted, based on the optical image. Also, in a case where the resist pattern is formed using the mask pattern, whether the resist pattern becomes pattern failure is determined, based on the feature quantity. Then, the pattern data of the mask pattern, the resist pattern of which is determined to become the pattern failure, is corrected such that the resist pattern does not become the pattern failure.

Hereinafter, a pattern data generation method, a pattern verification method, and an optical image calculation method according to embodiments will be described in detail with reference to the accompanying drawings. Also, the present invention is not limited by these embodiments.

(First Embodiment)

Figure 1:
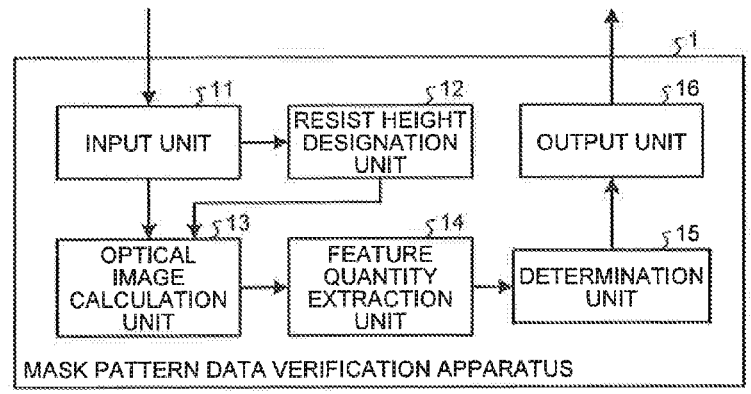
FIG. 1 is a block diagram illustrating a configuration of a mask pattern data verification apparatus according to a first embodiment.

FIG. 1 is a block diagram illustrating a configuration of a mask pattern data verification apparatus according to a first embodiment. The mask pattern data verification apparatus 1 is a computer or the like that performs a lithography compliance check (LCC) related to a cross-sectional shape or the like of a resist pattern formed using mask pattern data. The mask pattern data verification apparatus 1 calculates an optical image (aerial image) at each height of the resist pattern (resist film thickness position), and extracts feature quantity related to a cross-sectional shape of the resist pattern from each optical image. Then, the mask pattern data verification apparatus 1 performs pattern verification related to the cross-sectional shape of the resist pattern, based on the extracted feature quantity.

The mask pattern data verification apparatus 1 includes an input unit 11, a resist height designation unit 12, an optical image calculation unit 13, a feature quantity extraction unit 14, a determination unit 15, and an output unit 16. The input unit 11 inputs an exposure condition, a process condition, mask pattern data, and the like, and transmits them to the resist height designation unit 12. Also, the input unit 11 inputs information designating a plurality of film thickness positions (heights) to be verified (hereinafter, referred to as designated resist height), with respect to a resist pattern formed by performing an exposure process on a resist coated on a substrate, and transmits the information to the resist height designation unit 12. The mask pattern data is input from, for example, an external device (mask pattern data generation apparatus) to the input unit 11. Also, the exposure condition, the process condition, and the designated resist height, for example, are input through a mouse or keyboard to the input unit 11 by a user.

The resist height designation unit 12 is a memory or the like that stores the information designating a plurality of resist pattern heights as the designated resist height.

The optical image calculation unit 13 calculates the optical image at each resist pattern height (resist height), which is designated as the designated resist height, by using the exposure condition, the process condition, the mask pattern data, the designated resist height, and the like. The optical image calculated by the optical image calculation unit 13 is an optical image at the designated resist height when the resist on the substrate is exposed using the mask with the mask pattern. The optical image calculation unit 13 associates the calculated optical image and the resist height and transmits to the feature quantity extraction unit 14.

The feature quantity extraction unit 14, if necessary, modulates the optical image at each resist height. When modulating the optical image, a resist diffusion length, a threshold, an image offset, a slope modulation, and the like are used.

Also, the feature quantity extraction unit 14 extracts the feature quantity (the feature quantity of the optical image) related to the cross-sectional shape of the resist pattern from each optical image after the modulation or before the modulation. The feature quantity extraction unit 14, for example, calculates a resist cross-sectional shape from each optical image, based on a threshold of optical image intensity with respect to each optical image, and extracts feature quantity (dimension or the like) from the resist cross-sectional shape. The feature quantity extraction unit 14 associates the extracted feature quantity and the resist height and transmits to the determination unit 15.

The determination unit 15 determines the quality of the mask pattern data by using the feature quantity at each extracted resist height. In other words, the determination unit 15 performs pattern verification on the cross-sectional shape of the resist pattern. The determination unit 15 transmits the determination result (pass or fail of the verification, pattern position on the mask pattern where the resist pattern becomes pattern failure, and the like) to the output unit 16. The output unit 16 outputs the determination result to the external device or the like.

Figure 2:
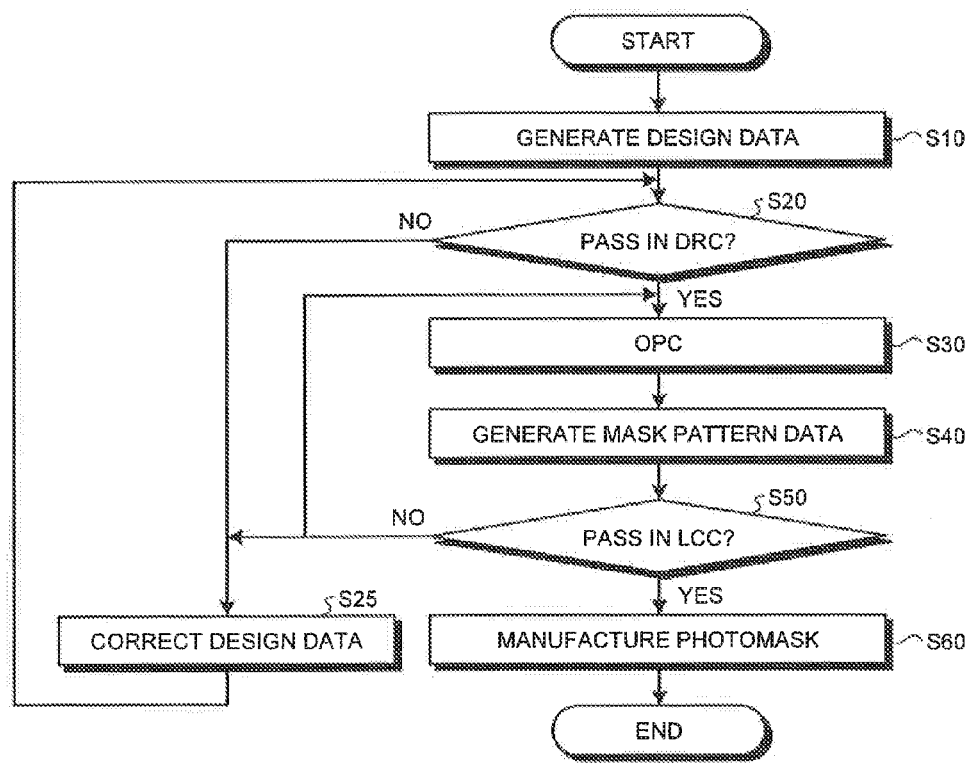
FIG. 2 is a flowchart illustrating a procedure of a process for manufacturing a photomask.

Next, a procedure of a process for manufacturing a photomask will be described. FIG. 2 is a flowchart illustrating a procedure of a process for manufacturing a photomask. First, design data corresponding to on-substrate patterns (circuit patterns or the like) formed on a substrate (wafer or the like) is generated (step S10).

A design rule check (DRC) is performed on the generated design data (step S20). The DRC is an error check to verify physical errors of a dimension between lines, a line width, and the like.

When failed in the DRC (No in step S20), the design data is corrected (step S25), and the DRC is performed again (step S20). Subsequently, the correction of the design data (step S25) and the DRC (step S20) are repeated until passed in the DRC.

On the other hand, when passed in the DRC (Yes in step S20), a lithography target (target pattern data) is generated using the design data. Subsequently, an optical proximity correction (OPC) is performed on the lithography target (step S30). In this way, mask pattern data is generated (step S40).

The generated mask pattern data is input to the input unit 11 of the mask pattern data verification apparatus 1. Subsequently, the LCC of the mask pattern data is performed in the mask pattern data verification apparatus 1 (step S50).

The LCC is a check to determine the pass or fail of the mask pattern data in the design/OPC step (before the mask is manufactured). In the LCC, an amount of an exposure margin or the like is verified by performing a lithography simulation after the generation of the mask pattern data. For example, a resist pattern dimension varying due to defocus, whether the resist pattern is shorted, or the like is verified, and the pass or fail of the mask pattern data is determined, based on the verification result. A position (hot spot) of the mask pattern determined as fail (pattern failure) in the LCC is a position of a mask pattern in which the probability that when the resist pattern is formed, the resist pattern will become the pattern failure is equal to or greater than a predetermined value.

When failed in the LCC (No in step S50), the correction of the design data, (step S25) or the OPC (step S30) is performed. In the case of correcting the design data, the processing of steps S25 to S50 is repeated. Also, in the case of performing the OPC, after an OPC condition is changed, the processing of steps S30 to S50 is repeated.

In other words, the design pattern of the mask pattern, which is determined as the hot spot (specific pattern layout with insufficient process margin) by the mask pattern data verification apparatus 1, or the OPC condition is corrected such that the hot spot is not detected by the mask pattern data verification apparatus 1. In this way, even when the resist pattern is formed by exposing the substrate with the corrected mask pattern, the poor formation of the resist pattern can be prevented by a dose/focus margin enough to form the pattern. Specifically, the collapse, shorting, film reduction, footing, or the like of the resist pattern can be prevented. Also, even when a pattern of an oxide film is formed by processing an oxide film of an underlying by using a resist pattern, a film thickness of the oxide film can be sufficiently maintained. Therefore, after burying metals between oxide films and performing a CMP, shorting between the metals can be prevented. When passed in the LCC (Yes in step S50), a photomask (mask for exposure) is manufactured using the passed mask pattern data (step S60).

Next, a procedure of a process for verifying the pattern of the mask pattern data. FIG. 3 is a flowchart illustrating a procedure of a process for verifying the pattern of the mask pattern data. When the mask pattern data verification apparatus 1 performs pattern verification (LCC) on the mask pattern data, the exposure condition, the process condition, the mask pattern data, and the like are input to the input unit 11 (step S110). In this way, the input unit 11 transmits the exposure condition, the process condition, and the mask pattern data to the resist height designation unit 12.

The exposure condition is a wavelength, an NA, an illumination, a focus, an aberration, an exposure amount, and the like. A plurality of exposure conditions may be designated using a focus exposure matrix (FEM). The process condition is a film thickness of the resist, a structure of an underlying layer (layer between resist and substrate) disposed at a lower layer than the resist.

Also, a designated resist height is input to the input unit 11. In this way, a resist height, which is the calculation target of the optical image, is designated (step S120). The input unit 11 transmits the designated resist height to the resist height designation unit 12. The resist height designation unit 12 transmits the designated resist height to the optical image calculation unit 13.

The optical image calculation unit 13 calculates the optical image within the resist at each resist height, which is designated as the designated resist height, by using the exposure condition, the process condition, the mask pattern data, and the designated resist pattern (step S130). At this time, in the exposure condition, a plurality of conditions, in which the dose or the focus is changed within a required lithography margin, is used. Also, in the process condition, the resist film thickness or the like is used. The optical image calculation unit 13 associates the calculated optical image and the resist height and transmits to the feature quantity extraction unit 14.

The feature quantity extraction unit 14, if necessary, modulates the optical image at each resist height (step S140). The feature quantity extraction unit 14 extracts the feature quantity related to the cross-sectional shape of the resist pattern from each optical image after the modulation or before the modulation (step S150). The feature quantity extraction unit 14 transmits the extracted feature quantity and the resist height to the determination unit 15 in association with each other.

The determination unit 15 determines the quality of the mask pattern data by using the feature quantity at each extracted resist height. The determination unit 15, for example, calculates a difference between the feature quantities (step S160). Subsequently, the determination unit 15 determines whether the calculated difference is equal to or less than a predetermined value (step S170).

When the calculated difference is equal to or less than the predetermined value (Yes in step S170), the determination unit 15 determines the pass in the LCC (step S180). When the calculated difference is greater than the predetermined value (No in step S170), the determination unit 15 determines the fail in the LCC (step S190).

Next, the relation between the optical image at each resist height and the cross-sectional shape of the resist pattern will be described. Among the resist patterns, poor formation occurs (1) when the cross-sectional shape of the resist pattern is sloped, (2) when the cross-sectional shape of the resist pattern is formed in an inversely tapered shape (shape in which a bottom portion is narrower than a top portion), (3) when the cross-sectional shape of the resist pattern is film-reduced in the height direction (film thickness is insufficient), and (4) when the cross-sectional shape of the resist pattern generates footing in a bottom portion. For example, in the case of (1) or (2), the resist pattern may be collapsed, and in the case of (3) or (4), the resist pattern may be opened (disconnected) or shorted (connected).

(1) In Case where Cross-Sectional Shape of Resist Pattern is Sloped.

FIGS. 4A to 4D are diagrams describing cross-sectional shapes of sloped resist patterns. FIG. 4A is a top view of a resist pattern 21 that is an example of the resist pattern. The cross-sectional shape of the resist pattern 21 may be sloped.

The cross-sectional shape when the resist pattern 21 is cut along line A1-A2 (transverse direction of line patterns) will be described. FIGS. 4B to 4D illustrate the resist cross-section optical images and the resist cross-sectional shapes along line A1-A2 of the resist pattern 21. In a case where the resist is a positive resist, a weak portion of the optical image intensity is a portion (formation region) where the resist pattern is left. In a case where the resist is a negative resist, a strong portion of the optical image intensity is a portion (formation region) where the resist pattern is left.

FIG. 4B illustrates the resist cross-section optical image and the resist cross-sectional shape when the focus is $-H_1$ (nm) (minus defocus). Also, FIG. 4C illustrates the resist cross-section optical image and the resist cross-sectional shape when the focus is a center. Also, FIG. 4D illustrates the resist cross-section optical image and the resist cross-sectional shape when the focus is $+H_1$ (nm) (plus defocus).

As illustrated in FIG. 4B, for example, when the focus is $-H_1$ (nm), the optical image 81 corresponding to the line pattern is sloped outward. Mao, as illustrated in FIG. 4C, when the focus is the center, the optical image 82 corresponding to the line pattern is not almost sloped. Also, as illustrated in FIG. 4D, when the focus is $+H_1$ (nm), the optical image 83 corresponding to the line pattern is sloped inward.

After development, the resist cross-sectional shape corresponding to the optical image 81 sloped outward is a resist cross-sectional shape 31. The resist cross-sectional shape 31 is derived by applying the optical image 81 to the lithography simulation. As in the optical image 81, the resist cross-sectional shape 31 is sloped outward. Specifically, the leftmost resist pattern (resist cross-sectional shape) among three resist patterns 21 (resist cross-sectional shape 31) is sloped leftward, and the rightmost resist pattern (resist cross-sectional shape) is sloped rightward.

After development, the resist cross-sectional shape corresponding to the optical image 82 being not almost sloped is a resist cross-sectional shape 32. The resist cross-sectional shape 32 is derived by applying the optical image 82 to the lithography simulation. As in the optical image 82, the resist cross-sectional shape 32 is not almost sloped.

After development, the resist cross-sectional shape corresponding to the optical image 83 sloped inward is a resist cross-sectional shape 33. The resist cross-sectional shape 33 is derived by applying the optical image 83 to the lithography simulation. As in the optical image 83, the resist cross-sectional shape 33 is sloped inward Specifically, the leftmost resist pattern (resist cross-sectional shape) among three resist patterns 21 (resist cross-sectional shape 33) is sloped rightward, and the rightmost resist pattern (resist cross-sectional shape) is sloped leftward.

Figures 5A, 5B:
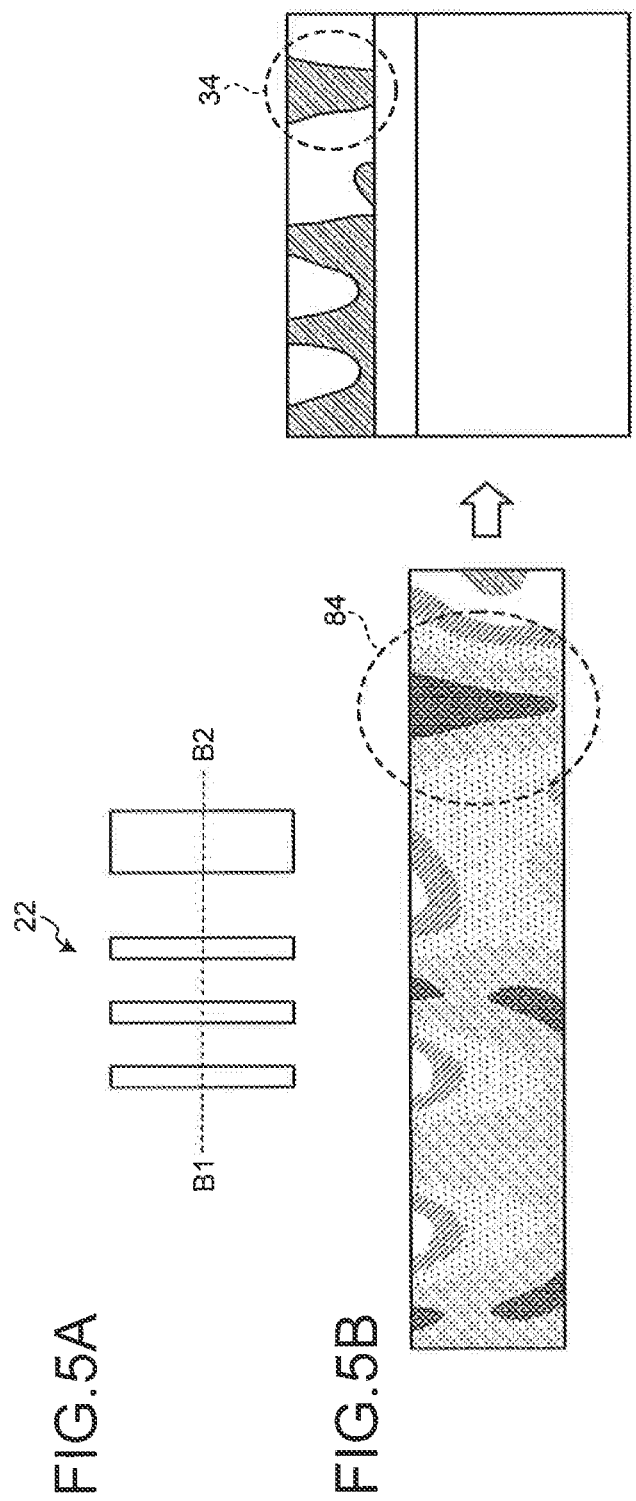
FIGS. 5A and 5B are diagrams describing a cross-sectional shape of an inversely tapered resist pattern.

(2) In Case where Cross-Sectional Shape of Resist Pattern is Inversely Tapered Shape FIGS. 5A and 5B are diagrams describing a cross-sectional shape of a resist pattern formed in an inversely tapered shape. FIG. 5A is a top view of a resist pattern 22 that is an example of the resist pattern. The cross-sectional shape of the resist pattern 22 may be an inversely tapered shape.

The cross-sectional shape when the resist pattern 22 is cut along line B1-B2 (transverse direction of line patterns) will be described. FIG. 5B illustrates the resist cross-section optical image and the resist cross-sectional shape along line B1-B2 of the resist pattern 22 when the focus is the minus defocus.

As illustrated in FIG. 5B, the optical image 84 corresponding to a part of the line patterns (herein, the rightmost line pattern) has an inversely tapered image. After development, the resist cross-sectional shape corresponding to the optical image 84 having the inversely tapered shape is a resist cross-sectional shape 34. The resist cross-sectional shape 34 is derived by applying the optical image 84 to the lithography simulation. As in the optical image 84, the resist cross-sectional shape 34 has the inversely tapered shape.

Also, in a case where the resist is a positive resist, when a region having weak optical image intensity has an inversely tapered shape, the resist cross-sectional shape 34 is formed in an inversely tapered shape. On the other hand, in a case where the resist is a negative resist, when a region having strong optical image intensity has an inversely tapered shape, the resist cross-sectional shape 34 is formed in an inversely tapered shape.

(3) In Case where Cross-Sectional Shape of Resist Pattern is Film-Reduced in Height Direction FIGS. 6A to 6C are diagrams describing cross-sectional shapes of resist patterns that are film-reduced in a height direction. FIG. 6A is a top view of a resist pattern 23 that is an example of the resist pattern. The cross-sectional shape of the resist pattern 23 may be film-reduced in the height direction.

The cross-sectional shape when the resist pattern 23 is cut along line C1-C2 (transverse direction of line patterns) will be described. FIGS. 6B and 6C illustrate the resist cross-section optical images and the resist cross-sectional shapes along line C1-C2 of the resist pattern 23. FIG. 6B illustrates the resist cross-section optical image and the resist cross-section shape when the focus is the center. Also, FIG. 6C illustrates the resist cross-section optical image and the resist cross-section shape when the focus is $+H_2$ (nm).

As illustrated in FIG. 6B, in a case where the focus is the center, the optical image 85 corresponding to a part of the line patterns (herein, three central line patterns) is distributed to have a desired resist film thickness. Also, as illustrated in FIG. 6C, when the focus is $+H_2$ (nm), the optical image 86 corresponding to a part of the line patterns is not distributed to have a desired resist film thickness.

After development, the resist cross-sectional shape corresponding to the optical image 85, which is distributed to have the desired resist film thickness, is a resist cross-sectional shape 35. The resist cross-sectional shape 35 is derived by applying the optical image 85 to the lithography simulation. As in the optical image 85, the resist cross-sectional shape 35 has the desired film thickness.

On the other hand, after development, the resist cross-sectional shape corresponding to the optical image 86, which is not distributed to have the desired resist film thickness, is a resist cross-sectional shape 36. The resist cross-sectional share 36 is derived by applying the optical image 86 to the lithography simulation. As in the optical image 86, the resist cross-sectional shape 36 does not reach the desired film thickness. In other words, a part of the resist patterns 23 are film-reduced in the height direction.

(4) In Case where Cross-Sectional Shape of Resist Pattern Generates Footing in Bottom Portion FIGS. 7A and 7B are diagrams describing a cross-sectional shape of a resist pattern that generates footing in a bottom portion. FIG. 7A is a top view of a resist pattern 24 that is an example of the resist pattern. The cross-sectional shape of the resist pattern 24 may be footing.

The cross-sectional shape when the resist pattern 24 is cut along line F1-F2 (transverse direction of line patterns) will be described. FIG. 7B illustrates the resist cross-section optical image and the resist cross-sectional shape along line F1-F2 of the resist pattern 24 when the focus is the plus defocus.

As illustrated in FIG. 7B, the optical image 87 between the line patterns (herein, between the line patterns of the central portion) generates footing in the bottom portion. After development, the resist cross-sectional shape corresponding to the optical image 87 generating footing in the bottom portion is a resist cross-sectional shape 37. The resist cross-sectional shape 37 is derived by applying the optical image 87 to the lithography simulation. As in the optical image 87, the resist cross-sectional shape 37 generates footing in the bottom portion.

The feature quantity extraction unit 14 extracts the feature quantities related to the above (1) to (4). Specifically, the feature quantity extraction unit 14 extracts any one of an inclination amount (inclination angle) of the resist pattern, a dimension related to an inversely tapered shape, an amount of film reduction in a height direction, and a footing amount in the bottom portion as the feature quantity.

The determination unit 15, for example, performs the LOG, based on whether the feature quantity extracted by the feature quantity extraction unit 14 is within an allowable range.

Also, in a case where the resist is a positive resist, when a region having weak optical image intensity is footing in the bottom portion, the resist cross-sectional shape 37 has a footing shape. On the other hand, in a case where the resist is a negative resist, when a region having strong optical image intensity is footing in the bottom portion, the resist cross-sectional shape 37 has a footing shape.

In the present embodiment, the feature quantity extraction unit 14 extracts the feature quantity from the optical image or the resist cross-sectional shape. For example, in a case where the feature quantity is extracted from the optical image, the feature quantity extraction unit 14 extracts the feature quantity, based on the outline of predetermined optical image intensity.

Figure 8A:
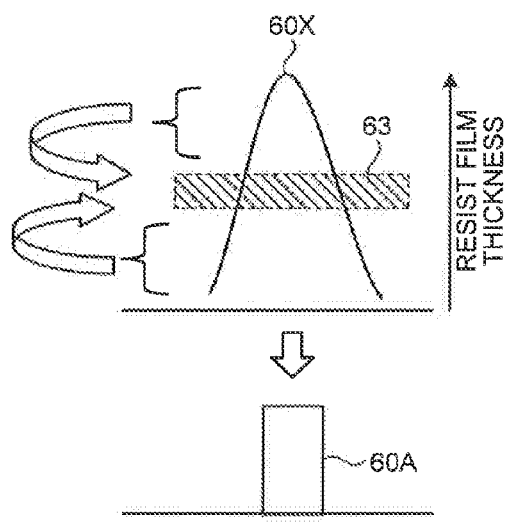
FIGS. 8A and 8B are diagrams describing a process for calculating an optical image.
Figure 8B:
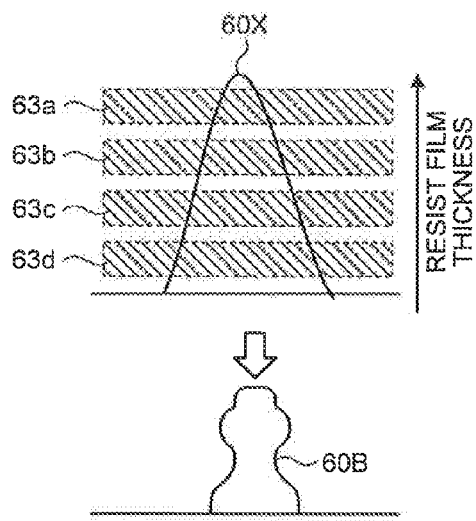

Next, a process for calculating the optical image intensity will be described. FIGS. 8A and 8B are diagrams describing a process for calculating an optical image. FIG. 8A illustrates a resist cross-sectional shape 60A when optical image intensity is averaged in a height direction (film thickness direction) of resist patterns. FIG. 8B illustrates a resist cross-sectional shape 60F when optical image intensity is used at a plurality of resist heights of resist patterns.

As illustrated in FIG. 8A, by averaging optical image intensity 60X in the resist film thickness direction, optical image intensity around the average value in the resist film thickness direction (resist film thickness position 63) is calculated. By deriving the resist patterns using the calculated optical image intensity, a resist cross-sectional shape 60A can be obtained. The resist cross-sectional shape 60A in this case has the same resist width at all film thickness positions.

As illustrated in FIG. 5B, a resist cross-sectional shape 60B can be obtained by calculating optical image intensity 60X at each of a plurality of resist film thickness positions and deriving a resist pattern by using the calculated optical image intensity 60X. FIG. 5B illustrates a case where the optical image intensity is calculated at each resist film thickness position of a first resist film thickness position 63a, a second resist film thickness position 63b, a third resist film thickness position 63c, and a fourth resist film thickness position 63d, and the resist cross-sectional shape 60B is calculated using the optical image intensity at each calculated resist film thickness position.

As illustrated in FIG. 8B, an accurate resist cross-sectional shape can be obtained by calculating the resist cross-sectional shape 60B using the optical image intensities at the plurality of resist film thickness positions (resist heights). In the present embodiment, the feature quantity calculation unit 14 of the mask pattern data verification apparatus 1 calculates the resist cross-sectional shape using the optical image intensity at the plurality of resist film thickness positions.

The feature quantity extraction unit 14 may calculate the resist cross-sectional shape of the designated resist height by using the optical image at the designated resist height (resist film thickness position) designated by the user.

Figure 9A:
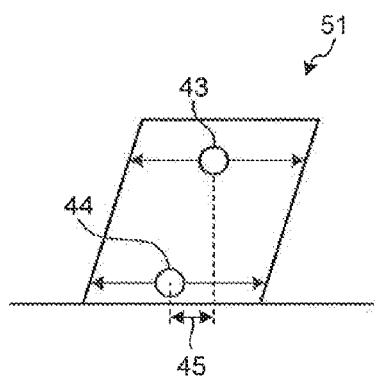
FIGS. 9A and 9B are diagrams describing a method for determining a slope or an inversely tapered shape of a resist pattern.
Figure 9B:
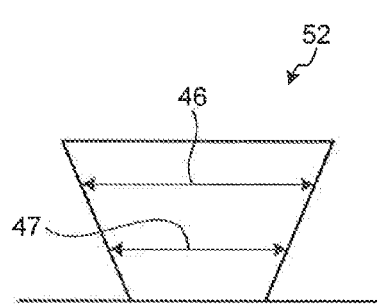

Next, an example of a method for determining the quality of the mask pattern data will be described. FIGS. 9A and 9B are diagrams describing a method for determining a slope or an inversely tapered shape of a resist pattern. FIG. 9A is a diagram describing a method for determining the quality of mask pattern data in a case where the resist pattern (optical image) is sloped. Also, FIG. 9B is a diagram describing a method for determining the Quality of mask pattern data in a case where the resist pattern (optical image) is formed in an inversely tapered shape.

In a case where exposure light irradiated on the mask pattern is a minus defocus, the resist pattern may be sloped outward or formed in an inversely tapered shape. Also, in a case where exposure light irradiated on the mask pattern is a plus defocus, the resist pattern may be sloped inward. In a case where the resist pattern is sloped or formed in an inversely tapered shape, pattern failure causing the collapse of the resist pattern may occur.

As illustrated in FIG. 9A, when determining the inclination of the resist pattern 51, the feature quantity extraction unit 14 calculates a central position (central portions of left, and right edges) 43 at a first height of the resist pattern 51, and a central position 44 at a second height of the resist pattern 51. In other words, the midpoint at the first height in the width direction and the midpoint at the second height in the width direction are extracted from the outline representing the cross-sectional shape of the resist pattern 51 by the feature quantity extraction unit 14.

Then, the determination unit 15 calculates a difference 45 in the resist pattern width direction by comparing the central position 43 at the first height with the central position 44 at the second height. In other words, an amount (difference 45) in which the central portion of the left and right edges of the resist cross-sectional shape changes between the heights (from the first height to the second height) is calculated. In this way, a variation in the height direction of the resist pattern 51 is calculated.

Also, in a case where a central position of a resist pattern group including a plurality of resist patterns is calculated, a central position at a first height of the resist pattern group may be set as the central position 43, and a central position at a second height of the resist pattern group may be set as the central position 44.

When the calculated difference 45 is equal to or less than a predetermined value, the determination unit 15 determines that the mask pattern data is normal. On the other hand, when the calculated difference 45 is greater than the predetermined value, the determination unit 15 determines that the mask pattern data is abnormal (dangerous). The predetermined value compared with the difference 45 is set in advance at each distance between the first height and the second height.

Also, the determination unit 15 may determine the normality/abnormality of the mask pattern data, based on a direction of a straight line connecting the central position 43 and the central position 44. In this case, when an angle formed by the straight line passing through the central positions 43 and 44 and a substrate surface is equal to or less than a predetermined value, the determination unit 15 determines that the mask pattern data is normal.

In a case where a positive resist is used, the shape of the remaining portion of the resist pattern (region corresponding to a light shielding portion in the photomask) may be inversely tapered (the upper portion of the resist becomes wider than the lower portion).

As illustrated in FIG. 9B, when determining whether the resist pattern 52 has the inversely tapered shape, the feature quantity extraction unit 14 calculates a pattern width 46 at a third height of the resist pattern 52 and a pattern width 47 at a fourth height of the resist pattern 52. In other words, the pattern widths 46 and 47 are extracted from the cross-sectional shape of the resist pattern 52 by the feature quantity extraction unit 14.

The determination unit 15 calculates the difference by comparing the pattern width 46 at the third height with the pattern width 47 at the fourth height. In other words, an amount in which the pattern width of the resist cross-sectional shape changes between the heights (from the third height to the fourth height) is calculated.

When the calculated difference is equal to or less than the predetermined value, the determination unit 15 determines that the mask pattern data is normal. On the other hand, when the calculated difference is greater than the predetermined value, the determination unit 15 determines that the mask pattern data is abnormal. Then, the determination unit 15 transmits the position (hot spot) where the abnormality occurs from the mask pattern data determined as abnormal, and the cross-sectional shape of the resist pattern determined as abnormal, to the output unit 16.

Figure 10A:
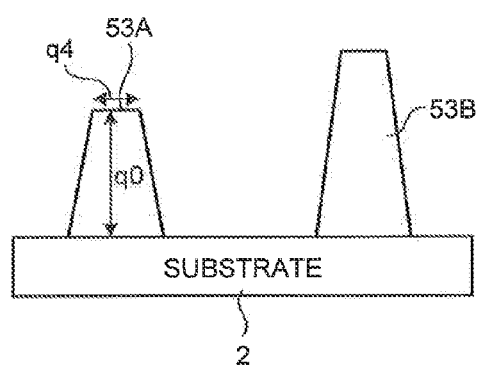
FIGS. 10A and 10B are diagrams describing a method for determining whether a resist pattern is film-reduced in a height direction.
Figure 10B:
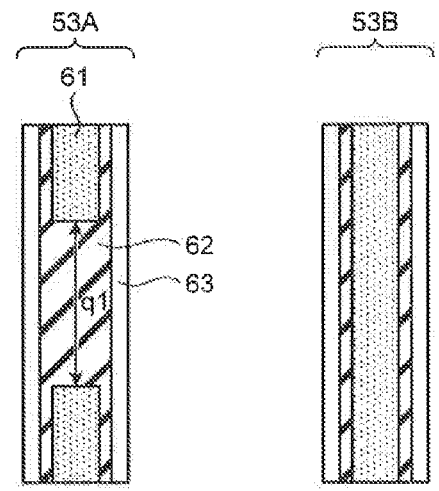

FIGS. 10A and 10B are diagrams describing a method for determining whether the resist pattern is film-reduced in the height direction. FIG. 10A illustrates a cross-sectional view of resist patterns 53A and 53S that are an example of the resist pattern, and FIG. 105 illustrates a top view of the resist patterns 53A and 53S.

In a case where a positive resist is used, when optical image intensity is equal to or greater than a predetermined value in the upper portion of the resist pattern, among the remaining portions of the resist pattern, the film reduction of the resist pattern occurs. The feature quantity extraction unit 14, for example, extracts a height (film thickness) q0 of the resist pattern 53A, which is formed on the substrate 2, as the feature quantity related to the cross-sectional shape of the resist pattern. Also, the feature quantity extraction unit 14 extracts a width q4 (transverse-direction dimension) of the resist pattern 53 at the height q0 as the feature quantity related to the cross-sectional shape of the resist pattern.

In a case where the resist pattern 53A is divided into an upper portion 61, a middle portion 62, and a lower portion 63, a part of the upper portion 61 may not be formed even though the middle portion 62 and the lower portion 63 are formed as a single line pattern. In this case, a distance q1 of an interval between the upper portion 61 and the upper portion 61 (disconnection interval) is extracted as the feature quantity related to the top surface shape of the resist pattern 53A (upper portion 61) by the feature quantity extraction unit 14. In other words, a length of a region that should be formed as the upper portion 61 but is not formed is extracted as die distance q1.

The feature quantity extraction unit 14 of the present embodiment extracts at least one of the height q0, the width q4, and the distance q1 as the feature quantity related to the shape of the resist pattern. For example, in the case of extracting the distance q1 or the width q4, the feature quantity extraction unit 14 has the user to designate the height q0.

In the case of extracting the distance q1, the feature quantity extraction unit 14 sets the upper portion 61 as a pattern with a height q0 or more. Then, the feature quantity extraction unit 14 calculates the distance q1 that is the longitudinal length of the region where the upper portion 61 is disconnected from the region where the upper portion 61 should be formed. At this time, the feature quantity extraction unit 14 calculates the distance q1 by using the resist cross-section optical image at a plurality of positions.

Also, in the case of extracting the width q4, the feature quantity extraction unit 14 extracts the resist cross-section optical image of the resist pattern 53A in which the resist pattern height is the height q0 in the resist cross-section optical image. Then, the feature quantity extraction unit 14 calculates the width q4, based on the extracted resist cross-section optical image.

The determination unit 15 determines whether the resist pattern 53A is film-reduced in the height direction, based on at least one of the height q0, the width q4, and the distance q1. The determination unit 15, for example, determines a position at which the height q0 is lower than a predetermined value, the width q4 is shorter than a predetermined value, and the distance q1 is longer than a predetermined value, as a hot spot at which the resist pattern 53A is film-reduced in the height direction.

Also, the determination unit 15 may determine a position at which the height q0 is lower than a predetermined value, a position at which the width q4 is shorter than a predetermined value, or a position at which the distance q1 is longer than a predetermined value, as a hot spot at which the resist pattern 53A is film-reduced in the height direction.

Also, the determination unit 15, for example, may determine a region, in which (distance q1)/(height q0×width q4) is greater than a predetermined value, as a hot spot (dangerous region) at which the resist pattern 53A is film-reduced in the height direction.

Also, the determination unit 15 may determine a region, in which a film reduction region (area) of the upper portion 61, that is, width q4×distance q1, is greater than a predetermined value, as a hot spot (dangerous region) at which the resist pattern 53A is film-reduced in the height direction.

Figure 11A:
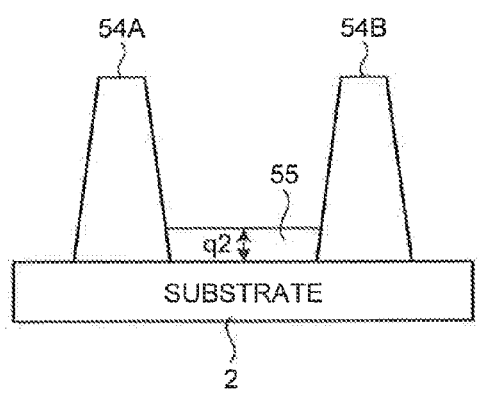
FIGS. 11A and 11B are diagrams describing a method for determining whether a resist pattern generates footing in a bottom portion.
Figure 11B:
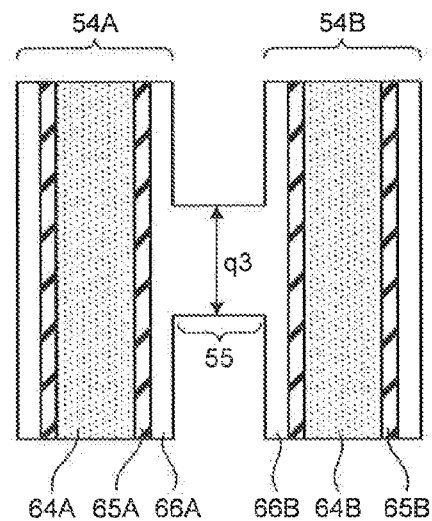

FIGS. 11A and 11B are diagrams describing a method for determining whether the resist pattern generates footing in the bottom portion. FIG. 11A illustrates a cross-sectional view of resist patterns 54A and 54B that are an example of the resist pattern, and FIG. 11B illustrates a top view of the resist patterns 54A and 54B.

In the case of using a positive resist, the shape of the removed portion of the resist pattern (region corresponding to a light, shielding portion in the photomask) may cause footing in the bottom portion. For example, footing is generated when optical image intensity between the resist patterns (at a place to be a space region) is lower than a predetermined value. The feature quantity extraction unit 14 extracts a height (film thickness) q2 of a resist film 55, which is formed between the resist pattern 54A and the resist pattern 54B formed on the substrate 2, as the feature quantity related to the cross-sectional shape of the resist pattern.

In a case where the resist pattern 54A is divided into an upper portion 64A, a middle portion 65A, and a lower portion 66A, and the resist pattern 54B is divided into an upper portion 64B, a middle portion 65B, and a lower portion 66E, an interval between the lower portion 66A and the lower portion 66B may be connected by the resist film 55. In this case, a distance q3 of the resist film 55 in, a longitudinal direction of the resist patterns 54 and 54B is extracted by the feature quantity extraction unit 14. In other words, in the resist film 55 formed by footing of the lower portions 66A and 66B, a vertical distance q3 between the lower portions 66A and 66B is extracted.

The feature quantity extraction unit 14 of the present embodiment extracts at least one of the height q2 and the distance q3 as the feature quantity related to the shape of the resist pattern. For example, in the case of extracting the distance q3, the feature quantity extraction unit 14 has the user to designate the height q2.

In the case of extracting the distance q3, the feature quantity extraction unit 14 sets the lower portions 66A and 66B as patterns with the height q2 or less. Then, the feature quantity extraction unit 14 extracts a region in which the resist pattern with the height q2 or more (resist film 55) is formed, from a region in which the resist pattern should not be formed. Also, the feature quantity extraction unit 14 calculates the distance q3 that is the longitudinal length of the region in which the resist film 55 is formed. At this time, the feature quantity extraction unit 14 calculates the distance q3 by using the resist cross-section optical image at a plurality of positions.

Also, the feature quantity extraction unit 14 may calculate the distance between the resist patterns (the width of the resist film 55) of the lower portions 66A and 66B, based on the resist cross-section optical images of the lower portions 66A and 66B and the resist film 55. In this way, the feature quantity extraction unit 14 can calculate the area of the resist film 55.

The determination unit 15 determines whether the resist patterns 54A and 5453 generate footing in the bottom portion, based on at least one of the height q2 and the distance q3. The determination unit 15, for example, determines a region in which the height q2 is higher than a predetermined value and the distance q3 is longer than a predetermined value, as a hot spot at which the resist patterns 54A and 54B generate footing in the bottom portion.

Also, the determination unit 15 may determine a position at which the height q2 is higher than a predetermined value or a position, at which the distance q3 is longer than a predetermined value, as a hot spot at which the resist patterns 54A and 54B generate footing in the bottom portion. Also, the determination unit 15, for example, may determine a position at which (distance q2)×(height q3) is greater than a predetermined value, as a hot spot at which the resist patterns 54A and 54B generate footing in the bottom portion.

Also, the determination unit 15 may determine the hot spot in the mask pattern, based on intensity distribution of optical images 81 to 86, without being limited to the resist cross-sectional shapes. In this case, whether being the hot spot is determined, based on the shape of the optical images 81 to 86 (slope or dimension of optical images having a magnitude of a predetermined value or more).

Also, the determination unit 15 may determine a region in which the region of the resist film 55 (footing region), that is, distance q3×width of resist film 55, is greater than a predetermined value, as a hot spot at which the resist patterns 54A and 54 generate footing in the bottom portion.

Figure 12:
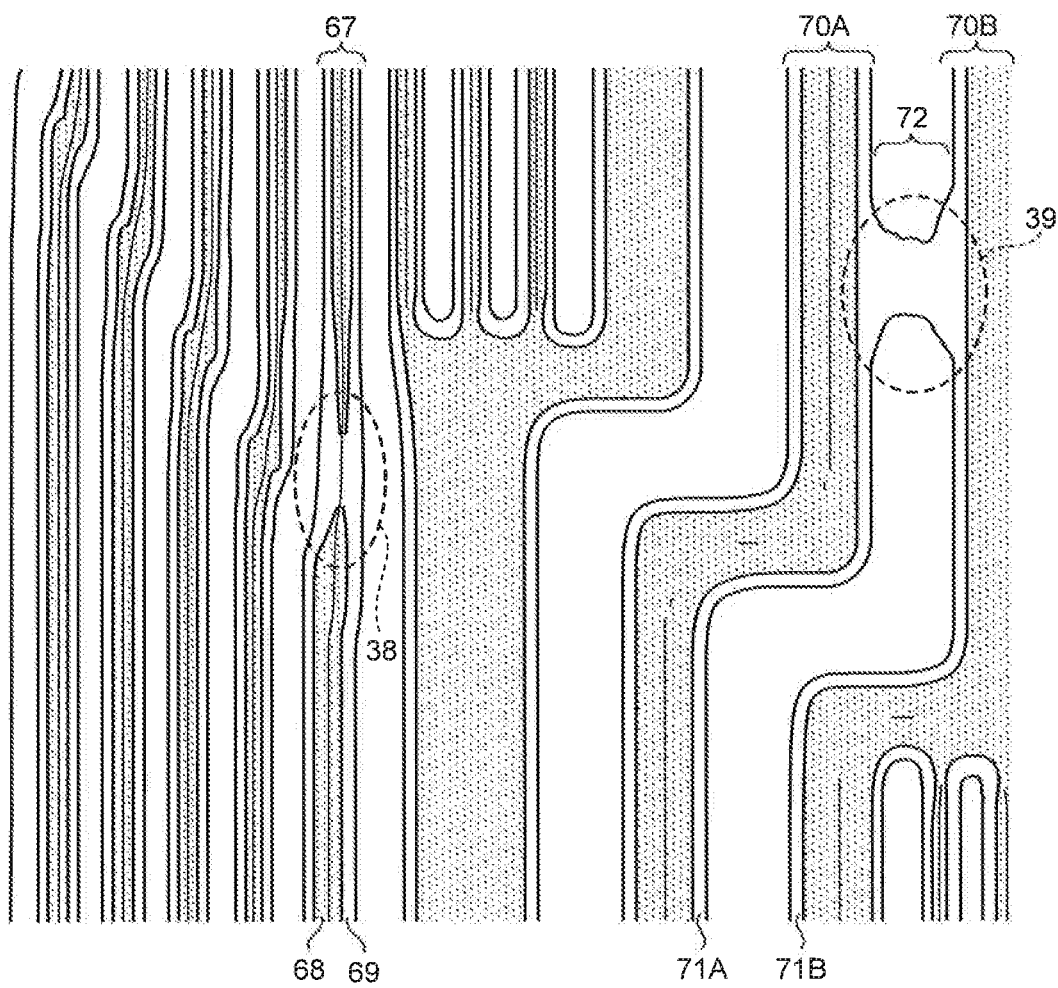
FIG. 12 is a diagram illustrating an example of poor formation of a resist pattern.

FIG. 12 is a diagram illustrating an example of poor formation of the resist pattern. FIG. 12 illustrates a top view of poor formation when a resist pattern 67 is film-reduced in a height direction, and poor formation when footing is generated between resist patterns 70A and 70E.

In a case where the resist pattern 67 is divided into an upper portion 68 and a lower portion 69, when the upper portion 68 is not formed at a desired position, it is determined that the resist pattern 67 is film-reduced in the height direction. In FIG. 12, at a position 38 of the resist pattern 67, the upper portion 68 is not formed at a desired position. Therefore, it is determined as a hot spot at which the position 38 of the resist pattern 67 is film-reduced in the height direction.

Also, in a case where resist patterns 70A and 70B are adjacent to each other, when a lower portion 71A of the resist pattern 70A and a lower portion 71B of the resist pattern 70B are connected by a resist film (remaining resist) 72, it is determined that the resist patterns 70A and 70B generate footing in the bottom portion. In other words, in a case where more than a predetermined of the resist film 72 remains in a space region between the resist patterns 70A and 70B, it is determined that footing is generated.

In FIG. 12, at the position 39 between the resist patterns 70A and 70S, the lower portion 71A and the lower portion 71B are connected by the resist film 72. Therefore, the position 39 is determined as a hot spot that generates footing in the bottom portion.

Figure 13:
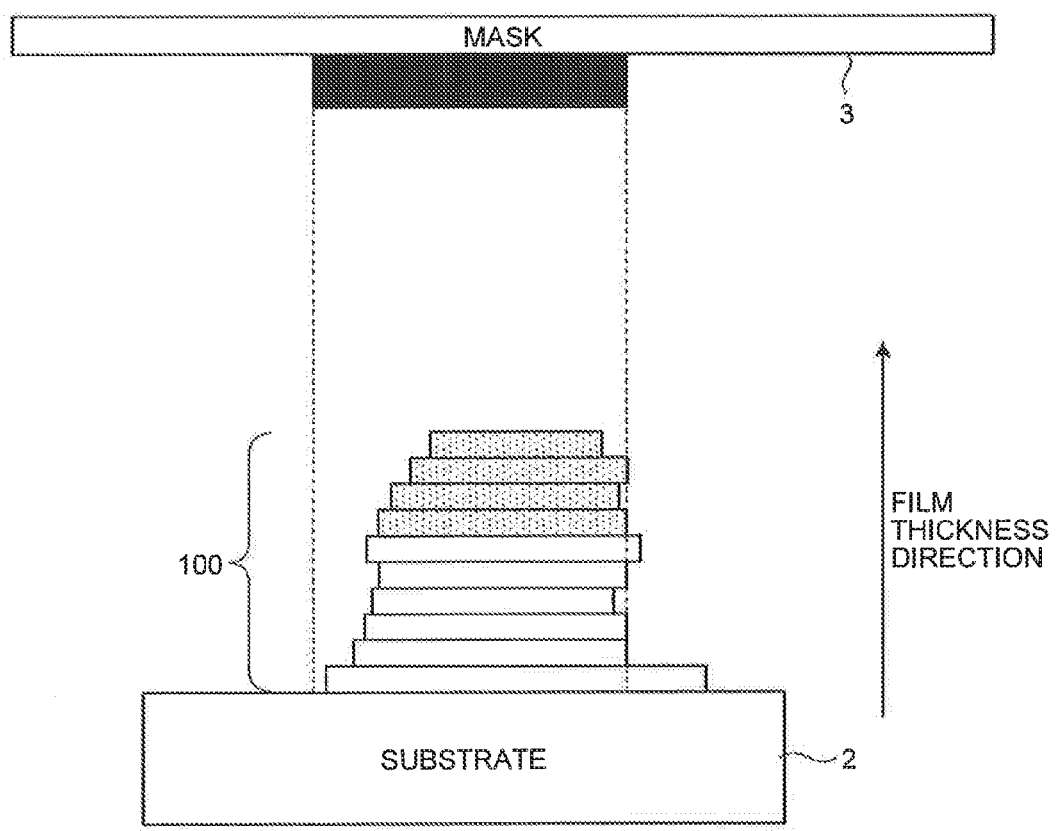
FIG. 13 is a diagram describing an example of a designation of a resist height.

FIG. 13 is a diagram describing an example of the designation of the resist height. FIG. 13 illustrates a cross-sectional view of a mask 3, a resist pattern 100, and a substrate 2. For example, when the film thickness of the resist pattern 100 is 80 nm, the optical image calculation unit 13 divides the resist pattern 100 by N (N is a natural number equal to or greater than 2) in the film thickness direction. FIG. 13 illustrates a case where the resist pattern 100 is divided by 10 in the film thickness direction.

The optical image calculation unit 13 calculates the optical image within the resist at each resist height or the designated resist height designated by the user. For example, in the lowermost portion of the resist pattern 100 divided by 10, an average value of optical images at heights of 0 to 8 nm or a value of an optical image at a height of 4 nm is calculated. Then, if necessary, the optical image is modulated, and the feature quantity of the optical image is calculated at each resist height.

For example, in a case where the upper portion of the resist pattern 100 is set as the fourth layer from the uppermost layer among the ten divided layers, the feature quantity extraction unit 14 calculates an average value of optical images of the first to fourth layers, and extracts a first feature quantity (pattern width or the like) from the calculated average value. Also, in a case where the lower portion of the resist pattern 100 is set as the lowermost layer among the ten divided layers, the feature quantity extraction unit 14 calculates a value of en optical image of the lowermost layer, and extracts a second feature quantity (pattern width or the like) from the calculated value.

Then, the determination unit 15 determines whether the resist pattern 100 is the hot spot, based on whether a difference between the first feature quantity and the second feature quantity extracted by the feature quantity extraction layer 14 is equal to or less than a predetermined value. With respect to mask pattern data of the resist pattern 100 determined as the hot spot, design data or OPC condition is corrected such that the resist pattern 100 does not become pattern failure. In this way, the mask pattern data is corrected.

By the way, in a case where an oxide film pattern is formed by etching an oxide film from above a resist pattern, when film reduction occurs in the resist pattern, a film thickness of the oxide film pattern becomes thin. In this case, when metals are buried between the oxide film patterns, the metals may be shorted to each other. Therefore, when the film reduction occurs in the resist pattern, the resist pattern may become the hot spot.

When etching the oxide film from above the resist pattern, an etching rate becomes faster as a ratio of an amount of the resist pattern (ratio of the pattern region to the space region) is smaller (as an opening area is wider). Therefore, as the ratio of the amount of the resist pattern is smaller, a large amount of a resist is consumed, and as a result, the degree of danger is increased. Therefore, when deriving the hot spot, the determination of the resist film reduction may be performed, based on a resist pattern density. Also, when deriving the hot spot, whether the resist pattern generates footing in the bottom portion may be determined, based on a resist pattern density.

Figure 14A:
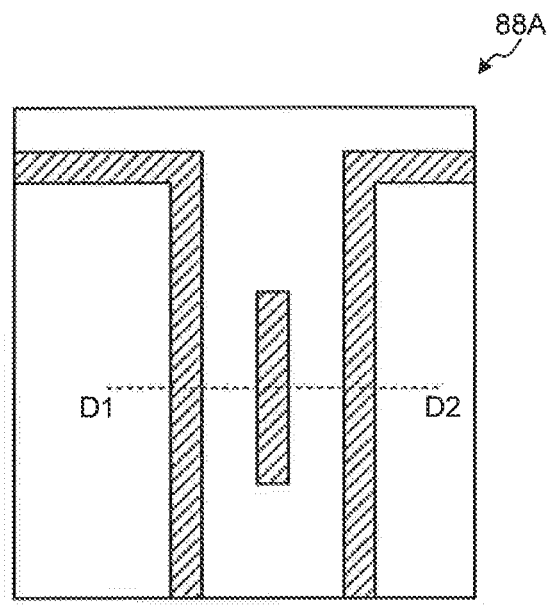
FIGS. 14A and 14B are diagrams describing a method for determining a film-reduction hot spot according to a pattern density.
Figure 14B:
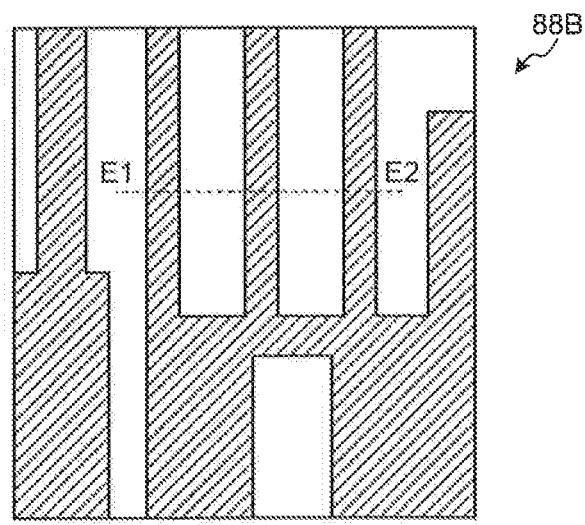

FIGS. 14A and 14B are diagrams describing a method for determining the film-reduction hot spot according to the pattern density. FIGS. 14A and 14B illustrate top views of the resist pattern. FIG. 14A illustrates a pattern region 88A having a small pattern density, and FIG. 14E illustrates a pattern region. BOB having a large pattern density.

Even though the mask pattern shape corresponding to the resist pattern cut along line D1-D2 and the mask pattern shape corresponding to the resist pattern cut along line E1-E2 are the same pattern shape, the pattern region 88A is smaller in pattern density than the pattern region 88B, and thus, the danger degree of the film reduction is increased.

Therefore, the determination unit 15 of the present embodiment may determine the hot spot in consideration of the resist pattern density into the film reduction determination method described in FIGS. 10A and 10B or the like. In this way, an accurate film reduction determination according to the pattern density can be performed.

The verification of the mask pattern data or the correction of the mask pattern data by the mask pattern data verification apparatus 1, for example, are performed at each layer of a wafer process. Then, if necessary, a photomask is manufactured using the corrected mask pattern data, and a semiconductor device (semiconductor integrated circuit) is manufactured using the manufactured photomask.

Specifically, after forming a predetermined film (processing target film) on a wafer, a resist is coated on the processing target film. Exposure is performed on the wafer coated with the resist by using a photomask. Then, the wafer is developed, and a resist pattern is formed on the wafer. Then, a lower layer side of the wafer is etched using the resist pattern as a mask. In this way, an actual pattern corresponding to the resist pattern is formed on the wafer. When manufacturing a semiconductor device, the verification of the mask pattern data, the correction of the mask pattern data, the film formation process, the exposure process, the development process, the etching process, and the like, which have been described above, are repeated for each layer.

Figure 15:
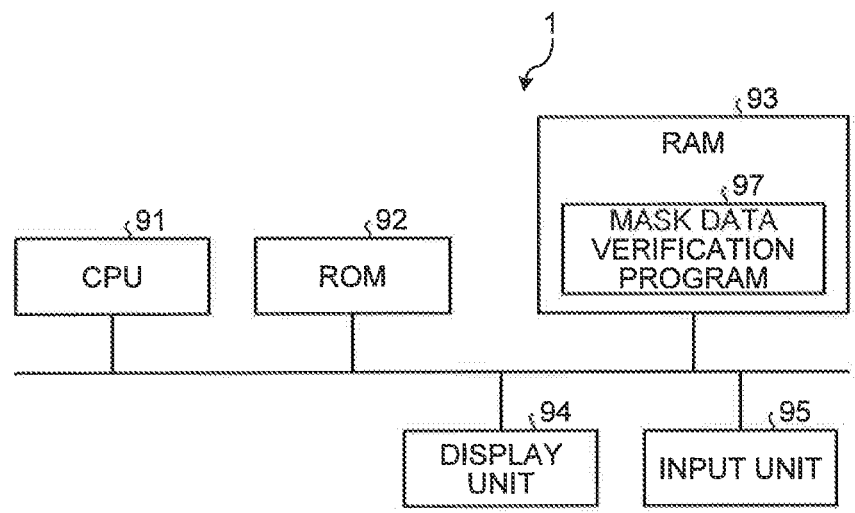
FIG. 15 is a diagram illustrating a hardware configuration of a mask pattern data verification apparatus.

Next, the hardware configuration of the mask pattern data verification apparatus 1 will be described. FIG. 15 is a diagram illustrating the hardware configuration of the mask pattern data verification apparatus. The mask pattern data verification apparatus 1 includes a central processing unit (CPU) 91, a read only memory (ROM) 92, a random access memory (RAM) 93, a display unit 94, and an input unit 95. In the mask pattern data verification apparatus 1, the CPU 91, the ROM 92, the RAM 93, the display unit 94, and the input unit 95 are connected through bus lines.

The CPU 91 performs mask pattern data verification by using a mask data verification program 92 that is a computer program. The mask data verification program 97 is a computer program product having a computer-readable and non-transitory recording medium including a plurality of instructions for verifying the mask pattern data. In the mask data verification program 97, the plurality of commands is executed on the computer to verify the mask pattern data.

The display unit 94 is a display device such as a liquid crystal display, and displays the optical image, the feature quantity, the mask pattern data determination result (verification result), and the like, based on the instruction from the CPU 91. The input unit 95 includes a mouse or a keyboard, and inputs instruction information (parameters for the mask pattern data verification, and the like) externally input from the user. The instruction information input to the input unit 95 is transmitted to the CPU 91.

The mask data verification program 97 is stored in the ROM 92 and is loaded on the RAM 93 through the bus line. FIG. 15 illustrates a state in which the mask data verification program 97 is loaded on the RAM 93.

The CPU 91 executes the mask data verification program 97 loaded on the RAM 93. Specifically, in the mask pattern data verification apparatus 1, the CPU 91 reads the mask data verification program 97 from the ROM 92 according to the instruction input from the input unit 95 by the user, loads the mask data verification program 97 into a program storage area within the RAM 93, and executes a variety of processing. The CPU 91 temporarily stores various data, which are generated during the variety of processing, in a data storage area formed within the RAM 93.

The mask data verification program 97 executed by the mask pattern data verification apparatus 1 is configured by a module including an optical image calculation unit 13, a feature quantity extraction unit 14, and a determination unit 15. These units are loaded on a main storage device and are generated on the main storage unit. Also, the optical image calculation process by the optical image calculation unit 13 may be executed by other programs.

According to the first embodiment described above, optical images are calculated at a plurality of heights of the resist pattern, and the mask pattern data are verified, based on the feature quantity related to the shape of the resist pattern, which is extracted from each of the optical images. Therefore, with respect to the mask pattern data, it is possible to verify whether the resist pattern can be formed with a sufficient lithography margin. This makes it possible to accurately determine the quality of the mask pattern data. Also, since the mask pattern data is corrected based on the verification result of the mask pattern data, the lithography margin of the mask pattern can be improved.

(Second Embodiment)

Next, a second embodiment of the present invention will be described with reference to FIGS. 16 and 17. In the second embodiment, the determination unit 15 determines whether being the hot spot, based on a maximum value or a minimum value of the optical image (optical intensity) at a predetermined resist film height (resist film thickness direction position).

The feature quantity extraction unit 14 of the present embodiment extracts the maximum value or the minimum value of the optical image at the predetermined resist height as the feature quantity of the optical image. Then, the determination unit 15 determines the nudity of the mask pattern data, based on the maximum value or the minimum value of the optical image at the predetermined resist height.

Figure 16:
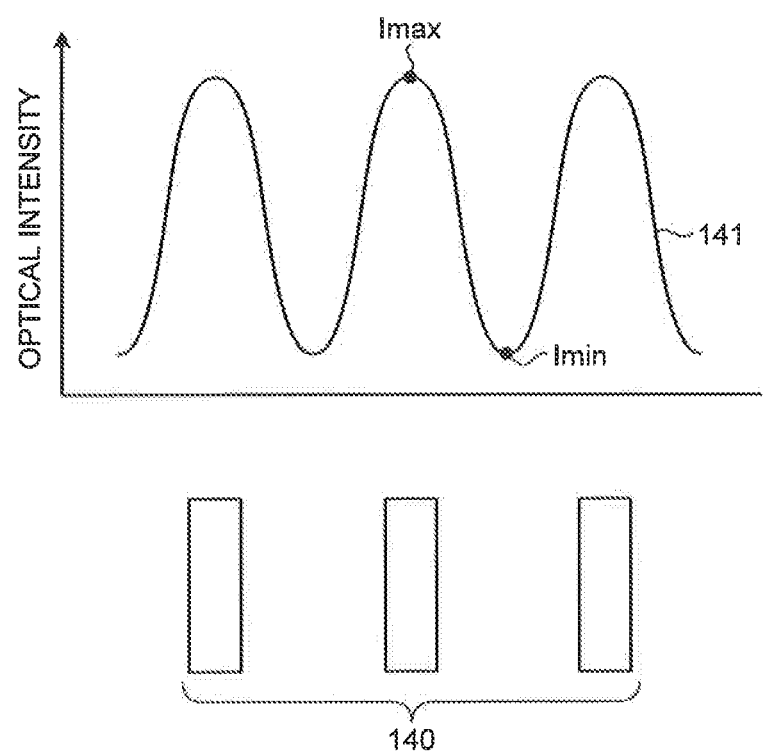
FIG. 16 is a diagram illustrating an example of an optical image at a predetermined resist height.

FIG. 16 is a diagram illustrating an example of the optical image at the predetermined resist height. The optical image calculation unit 13 calculates an optical image 141 in a case where a resist on a substrate is exposed using mask pattern data (for example, mask pattern. 140). At this time, the optical image calculation unit 13 calculates the optical image 141 at the predetermined resist height. For example, the optical image calculation unit 13 calculates the optical image 141 at each resist height.

The optical image calculation unit 13 transmits each calculated optical image 141 to the feature quantity extraction unit 14. The feature quantity extraction unit 14 extracts the maximum value Imax or the minimum value Imin of the optical image at each resist height as the feature quantity. The maximum value Imax is a maximum value (vertex value) in the single waveform (mountain) of the optical image 141, and the minimum value Imin is a minimum value (bottom value) in the single waveform (valley) of the optical image 141. The feature quantity extraction unit 14 associates the extracted feature quantity and the resist height and transmits to the determination unit 15.

The determination unit 15 determines whether the mask pattern 140 is the hot spot, based on the maximum value Imax or the minimum value Imin at least one resist height. In other words, the determination unit 15 detects a position as the hot spot, when the maximum value Imax or the minimum value Imin at one or more position of the resist film deepness direction (film thickness direction) satisfies a threshold value condition (a single condition or multiple conditions), which are set for the maximum value Imax or the minimum value Imin.

Figure 17:
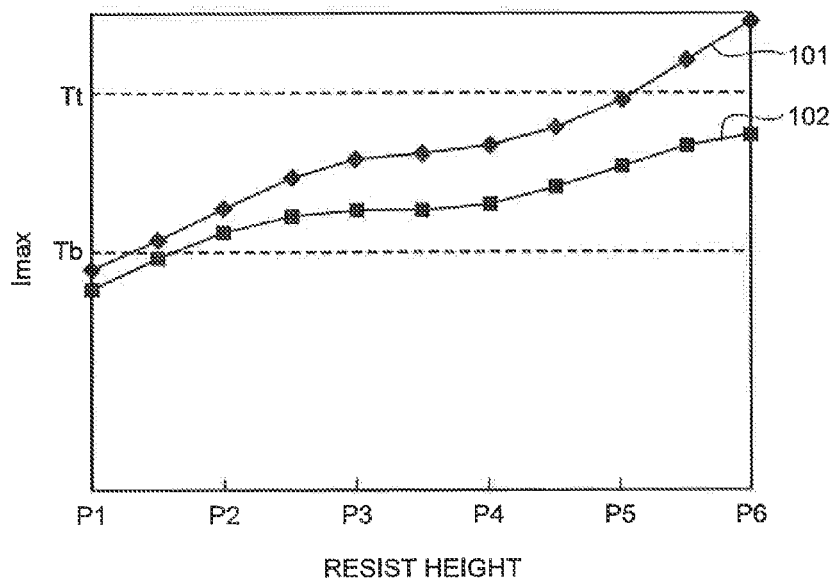
FIG. 17 is a diagram illustrating a maximum value of an optical image at each resist height.

FIG. 17 is a diagram illustrating the maximum value of the optical image at each resist height. In FIG. 17, a horizontal axis is a height, and a vertical axis is the maximum value Imax of the optical intensity. FIG. 17 illustrates an optical intensity characteristic of a first mask pattern 151 (not illustrated) and an optical intensity characteristic 102 of a second mask pattern 152 (not illustrated).

The determination unit 15, for example, determines whether mask patterns 151 and 152 are the hot spot, based on one or more threshold values for a maximum value Imax. FIG. 17 illustrates a first threshold value Tt for the maximum value Imax, and a second threshold value Tb for the maximum value Imax. The first threshold value Tt is a threshold value of the optical intensity for a position higher than a predetermined position of the resist (more than a predetermined resist height). Also, the second threshold value Tb is a threshold value of the optical intensity for a position lower than a predetermined position of the resist (less than a predetermined resist height).

For example, when a maximum value Imax of a resist height P6 is equal to or less than the threshold value Tt, the determination unit 15 determines the mask patterns 151 and 152 as the hot spot. In this case, the determination unit 15 determines the mask pattern 151 of the optical intensity characteristic 101 as the safety point, and determines the mask pattern 152 of the optical intensity characteristic 102 as the hot spot.

Also, for example, when a maximum value Imax of a resist height P1 is equal to or less than the threshold value Tb, the determination unit 15 may determine the mask patterns 151 and 152 as the hot spot. In this case, the determination unit 15 determines the mask pattern 151 of the optical intensity characteristic 101 as the hot spot, and determines the mask pattern 152 of the optical intensity characteristic 102 as the hot spot.

Also, for example, when the maximum value Imax of the resist height P6 is equal to or less than the threshold value Tt and the maximum value Imax of the resist height. P1 is equal to or less than the threshold value Tb, the determination unit 15 may determine the mask patterns 151 and 152 as the hot spot. In this case, the determination unit 15 determines the mask pattern 152 of the optical intensity characteristic 102 as the hot spot.

Also, the determination unit 15 may determine whether mask patterns 151 and 152 are the hot spot, based on one or more threshold values for a minimum value Imin. In this case, the determination unit 15, for example, determines whether the mask patterns 151 and 152 are the hot spot, based on a threshold value of a minimum value Imin for a position higher than a predetermined position of a resist, or a minimum value of a minimum value Imin for a position lower than a predetermined position of a resist.

For example, when the minimum value Imin of the resist height P6 is equal to or more than the third threshold value, the determination unit 15 determines the mask patterns 151 and 152 as the hot spot. Also, for example, when the minimum value Imin of the resist height P1 is equal to or more than the fourth threshold value, the determination unit 15 determines the mask patterns 151 and 152 as the hot spot.

Also, when the minimum value Imin of the resist height P6 is equal to or more than the third threshold value and the minimum value Imin of the resist height P1 is equal to or more than the fourth threshold value, the determination unit 15 may determine the mask patterns 151 and 152 as the hot spot.

Also, the determination unit 15 may determine whether mask patterns 151 and 152 are the hot spot, based on the maximum value Imax and the minimum value Imin. Also, the determination unit 15 may determine whether mask patterns 151 and 152 are the hot spot, based on the average value of the maximum values Imax at the respective resist heights. Also, the determination unit 15 may determine whether mask patterns 151 and 152 are the hot spot, based on the average value of the minimum values Imin at the respective resist heights.

The determination unit 15 of the present embodiment determines whether the mask patterns 151 and 152 and the like, are the hot spot by using determination conditions set for each type of pattern failure (film thickness, footing, and the like). In the determination unit 15, determination conditions using a combination of the threshold value of the maximum value Imax or the threshold value of the minimum value Imin, and the like, are set in advance for each type of pattern failure.

The determination unit 15 determines whether the mask patterns 151 and 152 and the like are the hot spot, by using the respective determination conditions. In this way, when the mask patterns 151 and 152 and the like are the hot spot, the determination unit 15 can determine to which kind of the pattern failure the mask patterns 151 and 152 correspond. The determination unit 15 determines whether various mask patterns within the mask pattern data are the hot spot.

According to the second embodiment described above, the determination unit 15 performs the determination of the hot spot, based on the maximum value Imax or the minimum value Imin of the optical intensity at a predetermined resist height. Therefore, the determination of the hot spot can be performed easily and accurately.

(Third Embodiment)

Next, a third embodiment of the present invention will be described with reference to FIG. 18. In the third embodiment, the feature quantity extraction unit 14 applies modulation to the optical image such that a difference between a maximum value Imax of a hot spot group and a maximum value Imax of a safety point group becomes an appropriate value according to pattern failure. Also, the feature quantity extraction unit 14 applies modulation to the optical image such that a difference between a minimum value Imin of a hot spot group and a minimum value Imin of a safety point group becomes an appropriate value according to pattern failure.

The feature quantity extraction unit 14 of the present embodiment, for example, divides the respective mask patterns into groups, based on the maximum value Imax of the optical images of the respective mask pattern. The feature quantity extraction unit 14 sets mask patterns, whose maximum value Imax is within a predetermined range, as the safety point group. Also, the feature quantity extraction unit 14 sets mask patterns, of which maximum value Imax is out of a predetermined range, as the hot spot group. In this case, the feature quantity extraction unit 14 may set the respective mask patterns as any one of a plurality of hot spot groups for each magnitude of the maximum value Imax. For example, the feature quantity extraction unit 14 sets mask patterns, whose maximum value Imax is within a first range, as a first hot spot group, and sets mask patterns, whose maximum value Imax is within an M-th range (M is an integer equal to or greater than 2), as an M-th hot spot group.

Figure 18:
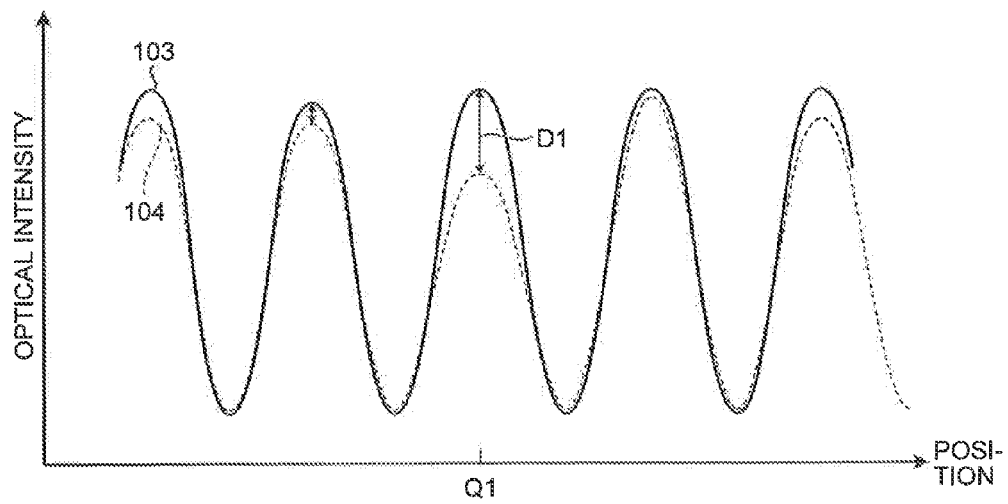
FIG. 18 is a diagram describing an optical image modulation method according to a third embodiment.

FIG. 18 is a diagram describing an optical image modulation method according to a third embodiment. In FIG. 18, a horizontal axis is a position of a mask pattern, and a vertical axis is an optical intensity. In FIG. 18, an average value of an optical intensity characteristic of a hot spot group is represented by a hot spot characteristic 104, and an average value of an optical intensity characteristic of a safety point group is represented by a safety point characteristic 103.

The optical intensity characteristic used for calculation of the average value of the hot spot characteristic 101 (optical intensity characteristic at each hot spot) may be an optical intensity characteristic at a predetermined resist height, or may be an average value of an optical intensity characteristic at each resist height. Also, the optical intensity characteristic used for calculation of the average value of the safety point characteristic 103 (optical intensity characteristic at each safety point) may be an optical intensity characteristic at a predetermined resist height, or may be an average value of an optical intensity characteristic at each resist height.

The feature quantity extraction unit 14 performs modulation on the optical images (hot spot characteristic 104 and safety point characteristic 103) such that a difference D1 between the hot spot characteristic 104 and the safety point characteristic 103 becomes an appropriate value according to an actual resist pattern (appropriate value according to pattern failure).

The feature quantity extraction unit 14 modulates the optical image a predetermined position of the mask pattern (herein, position Q1), based on the difference D1 between the maximum value Imax of the hot spot characteristic 104 and the maximum value Imax of the safety point characteristic 103. Specifically, the feature quantity extraction unit 14 performs modulation on the optical image such that a statistically significant difference of the difference D1 between the maximum value Imax at the position Q1 of the hot spot characteristic 104 and the maximum value Imax at the position Q1 of the safety point characteristic 103 (difference of the average values of the respective groups) becomes maximum. The feature quantity extraction unit 14, for example, modulates the optical image such that the difference D1 between the maximum value Imax at the position Q1 of the hot spot characteristic 104 and the maximum value Imax at the position Q of the safety point characteristic 103 becomes maximum.

Also, the feature quantity extraction unit 14 may modulate the optical image such that the hot spot characteristic 104 and the safety point characteristic 103 becomes close to the optical intensity characteristic of the actual resist pattern. Also, when a plurality of hot spot groups is set, the feature quantity extraction unit 14 may modulate the optical image, based on the average value of the optical intensity characteristic of each hot spot group and the optical intensity characteristic of the safety point group. In this case, the feature quantity extraction unit 14 modulates the optical image, such that the statistically significant difference of the average values of the groups (safety point group, first hot spot group, . . . , L-th hot spot group) becomes maximum.

Also, the feature quantity extraction unit 14 may modulate the optical image at a predetermined position of the mask pattern, based on the difference between the minimum value Imin of the hot spot characteristic 104 and the minimum value Imin of the safety point characteristic 103.

Also, the feature quantity extraction unit 14 may modulate the optical image at a predetermined position of the mask pattern, based on the difference between the minimum value Imin of the hot spot characteristic 104 and the minimum value Imin of the safety point characteristic 103 and the difference D1 between the maximum value Imax of the hot spot characteristic 104 and the maximum value Imax of the safety point characteristic 103. In this case, the feature quantity extraction unit 14 modulates the optical image such that the maximum value Imax of the hot spot group is within a first range and the minimum value Imin of the hot spot group is within a second range.

The determination unit 15 performs the determination of the hot spot by using the optical image modulated by the feature quantity extraction unit 14. The determination unit 15, for example, performs the determination of the hot spot by using the method described in the second embodiment.

In this way, since the feature quantity extraction unit 14 modulates the optical image, based on the difference D1 between the maximum value Imax of the hot spot characteristic 104 and the maximum value Imax of the safety point characteristic 103, the optical image can be modulated into the optical image corresponding to the actual resist pattern.

Also, since the feature quantity extraction unit 14 modulates the optical image, based on the difference between the minimum value Imin of the hot spot characteristic 104 and the minimum value Imin of the safety point characteristic 103, the optical image can be modulated into the Optical image corresponding to the actual resist pattern.

Also, the determination unit 14 may modulate the optical image, based on the magnitude of at least one of the maximum value Imax and the minimum value Imin of the hot spot group. In this case, the feature quantity extraction unit 14 modulates the optical image such that the maximum value Imax of the hot spot group is within a predetermined range, or modulates the optical image such that the minimum value Imin of the hot spot group is within a second range.

According to the third embodiment described above, since the determination unit 15 performs the determination of the hot spot, based on the maximum value Imax or the minimum value Imin of the optical intensity at a predetermined resist height, the determination of the hot spot can be performed easily and accurately.

(Fourth Embodiment)

Next, a fourth embodiment of the present invention will be described with reference to FIG. 19. In the fourth embodiment, when the determination unit 15 of the second embodiment determines the hot spot, correction processing or modification processing is performed to remove the hot spot.

Figure 19:
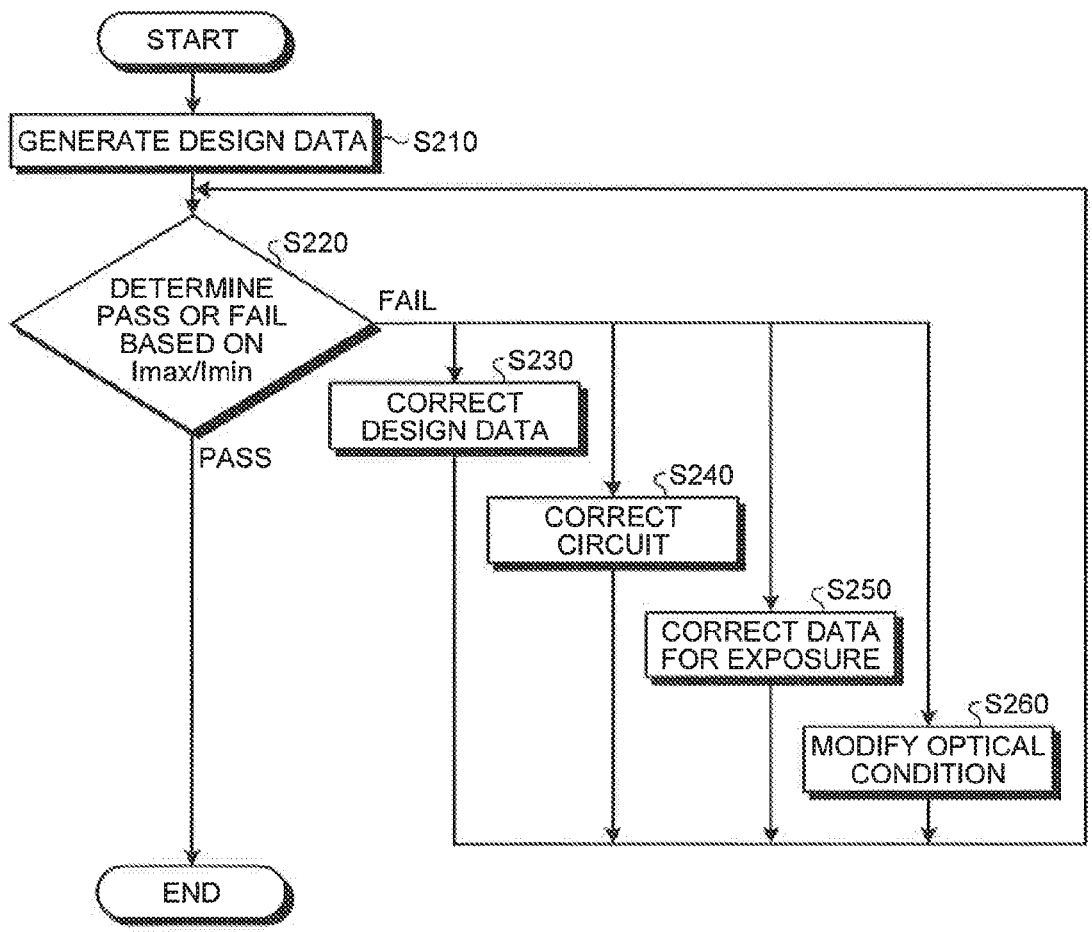
FIG. 19 is a flowchart illustrating a processing procedure of a process for eliminating a hot spot.

FIG. 19 is a flowchart illustrating a processing procedure of a process for eliminating a hot spot. By the same processing procedure as that of the first embodiment, mask pattern data is generated. Specifically, design data (layout) corresponding to on-substrate patterns formed on a substrate is generated (step S210). Subsequently, until the design data passes in the DRC, the correction of the design data and the DRC are repeated.

When the design data passes in the DRC, a lithography target is generated using the design data. Subsequently, mask pattern data is generated by performing OPC on the lithography target.

Subsequently, the mask pattern data verification apparatus 1 extracts hot spots from the mask pattern data by using the method described in the second embodiment, or the like. Specifically, the determination unit 15 determines whether at least one of a maximum value Imax and a minimum value Imin at each position in a resist film thickness direction satisfies a condition (single condition or multiple conditions) for the optical image, which is set based on a predetermined threshold value. In this way, the determination unit 15 performs the determination of the hot spot (determines pass or fail), used on the maximum value Imax or the minimum value Imin (step S220).

In the determination of the hot spot, when the determination unit 15 determines the fail (in step S220, fail), correction or modification is performed such that at least one of the maximum value Imax and the minimum value Imin satisfies the condition for the optical image. In other words, when the hot spot is extracted, correction processing or modification processing is performed such that it is determined as pass in the determination of the hot spot.

As the correction processing or the modification processing, for example, at least one of correction of the design data (step S230), correction of the circuit (step S240), correction of data for exposure (step S250), and modification of the optical condition (step S260) is performed. The data for exposure is, for example, an OPC condition or the like, and the optical condition is, for example, an illumination condition or the like.

Subsequently, the processing of steps S220 to S260 is repeated until the determination unit 15 determines the pass (until the hot spot is eliminated). When the determination unit 15 determines the pass (step S220, pass), the mask pattern data is output from the output unit 16.

According to the fourth embodiment described above, when it is determined that the hot spot is present in the hot spot determination based on the maximum value Imax or the minimum value Imin, at least one of the correction of the design data, the correction of the circuit, the correction of the data for exposure, and the modification of the optical condition is performed. Therefore, the hot spot can be eliminated easily and accurately.

(Fifth Embodiment)

Next, a fifth embodiment of the present invention will be described with reference to FIG. 20. In the fifth embodiment, the optical image is modulated such that a secondary electronic profile (waveform) of a scanning electron microscope (SEM) derived using the optical image at each resist height becomes close to an actual secondary electronic profile of the SEM.

FIG. 20 is a flowchart illustrating a processing procedure of optical image modulating processing according to the fifth embodiment. By the same processing procedure as that of the first embodiment, the mask pattern data verification apparatus 1 calculates resist cross-sectional shapes, based on optical images. Specifically, the optical image calculation unit 13 calculates optical images at a plurality of resist heights, and the feature quantity extraction unit 14 calculates resist cross-sectional shapes by using the optical images at the respective resist heights (step S310).

The feature quantity extraction unit 14, if necessary, modulates the optical image at each resist height (step S320). When the optical image is modulated, the feature quantity extraction unit 14 calculates the resist cross-sectional shape by using the intensity of the modulated optical image.

Also, the feature quantity extraction unit 14 derives the secondary electronic profile, which is obtained when a resist pattern dimension is measured from above the top surface by the SEM, through a simulation (step S330). At this time, the feature quantity extraction unit 14 derives the secondary electronic profile, based on the resist cross-sectional shape calculated using the optical image intensity at the plurality of resist heights. Also, the secondary electronic profile is obtained by measuring the resist pattern dimension by the actual SEM.

The feature quantity calculation unit 14 compares the secondary electronic profile derived by the simulation with the secondary electronic profile actually obtained from the SEM (step S340). The feature quantity extraction unit 14 determines whether the optical image is pass or fail, based on the comparison result (step S350).

When the degree of similarity between the secondary electronic profile derived by the simulation and the secondary electronic profile actually obtained from the SEM is out of a predetermined range, the determination unit 15 determines the optical image as fail (step S350, fail). In this case, the feature quantity extraction unit 14 modulates the optical image (step S320). At this time, the feature quantity extraction unit 14 modulates the optical image such that the secondary electronic profile of the SEM, which is derived using the optical image at each resist height, becomes close to the actual secondary electronic profile of the SEM.

Subsequently, the feature quantity extraction unit 14 derives the secondary electronic profile, which is obtained when the resist pattern dimension is measured from above the top surface by the SEM, through a simulation (step S330). Also, the feature quantity calculation unit 14 compares the secondary electronic profile derived by the simulation with the secondary electronic profile actually obtained from the SEM (step S340). The feature quantity extraction unit 14 determines whether the optical image is pass or fail, based on the comparison result (step S350).

When the degree of similarity between the secondary electronic profile derived by the simulation and the secondary electronic profile actually obtained from the SEM is out of a predetermined range, the optical image is fail (step S350, fail), and therefore, the feature quantity extraction unit 14 repeats the processing of steps S320 to S350.

The feature quantity extraction unit 14 repeats the processing of steps S320 to S350 until the optical image is passed. When the degree of similarity between the secondary electronic profile derived by the simulation and the secondary electronic profile actually obtained from the SEM is within a predetermined range, the optical image is pass (step S350, pass), and therefore, the feature quantity extraction unit 14 ends the modulation processing.

A CD-SEM length measurement value (hereinafter, referred to as a CD value) of the resist pattern used in a resist modeling is calculated from the secondary electronic profile. In this case, when the correspondence of the resist cross-sectional position corresponding to the CD value is not clear, an accurate dimension of the resist pattern (dimension when viewed from above the top surface) cannot be measured.

In the present embodiment, since the optical image is modulated such that the degree of similarity between the secondary electronic profile derived by the simulation and the secondary electronic profile actually obtained from the SEM is within a predetermined range, it is possible to perform appropriate modulation according to the actual resist cross-sectional shape. Therefore, the accurate resist cross-sectional shape can be derived, based on the appropriately modulated optical image.

According to the fifth embodiment described above, since the optical image is modulated such that the secondary electronic profile of the SEM, which is derived using the optical image at each resist height, becomes close to the actual secondary electronic profile of the SEM, appropriate modulation can be performed on the optical image.

(Sixth Embodiment)

Next, a sixth embodiment of the present invention will be described with reference to FIGS. 21A and 21B. In the sixth embodiment, the quality of sub-resolution assist feature (SRAF) is determined, based on a thickness at which the SPAS is transferred on the resist.

The use of the SPAS (assist pattern) can improve the lithography margin. However, in general, the adjustment of the shape or arrangement of the SRAF is performed such that the lithography margin becomes maximum in a range where the SPAS is not transferred. In this case, when the mask pattern is transferred on the resist by using the ERAS, the ERAS may be transferred on the resist.

Originally, after processing the resist pattern, if the SRAF is not transferred on a lower layer side than a resist layer, there is no problem even though the SRAF is transferred at the time of development of the resist. However, in the resist observation from top by the CD-SEM, it is difficult to determine whether the SRAF transferred on the lower layer side than the resist layer.

Thus, the mask pattern data verification apparatus 1 of the present embodiment calculates the resist cross-sectional shape by using the optical images at the plurality of resist heights, and calculates the feature quantity defining the resist cross-sectional shape. Subsequently, the mask pattern data verification apparatus 1 performs quality determination as to whether the SRAF is the transfer with no problem, based on the feature quantity.

Specifically, the optical image calculation unit 13 calculates optical images at a plurality of resist heights, and the feature quantity extraction unit 14 calculates resist cross-sectional shapes by using optical image intensities at the respective resist heights.

FIG. 21A is a diagram illustrating the resist pattern shape when the SRAF is not transferred on the resist, and FIG. 21B is a diagram illustrating the resist pattern shape when the SRAF is transferred on the resist.

The upper sides of FIGS. 21A and 21B illustrate the top surface shapes of the resist patterns, and the lower sides of FIGS. 21A and 21B illustrate the cross-sectional shapes of the resist patterns. The resist pattern 110 illustrated in FIG. 21A and the resist pattern 120 illustrated in FIG. 21B are resist patterns to be transferred on the lower layer side of the resist pattern. Also, the resist pattern 130 illustrated in FIG. 21B is a pattern on which the SRAF is transferred, and is a pattern that is not transferred on the lower layer side of the resist pattern.

By the same processing procedure as that of the first embodiment, the mask pattern data verification apparatus 1 calculates the resist cross-sectional shape, based on the optical image. In FIG. 21A, as the cross-sectional shape of the resist pattern 110, the resist cross-sectional shapes 111-1 at the first resist height to the resist cross-sectional shape 111-$n$ at the n-th resist height (n is a natural number) are illustrated.

Also, in FIG. 21B, as the cross-sectional shape of the resist pattern 120, the resist cross-sectional shapes 121-1 at the first resist height to the resist cross-sectional shape 121-$n$ at the n-th resist height are illustrated.

As illustrated in FIG. 21A, as the top surface shape of the resist pattern, the transfer pattern of the SRAF is not generated, but as the cross-sectional shape of the resist pattern, the transfer pattern 112 of the SRAF may be generated. The transfer pattern 112 is a resist pattern generated at a single resist height.

Also, as illustrated in FIG. 21B, as the top surface shape of the resist pattern, the transfer pattern of the SRAF may be generated, and as the cross-sectional shape of the resist pattern, the transfer patterns 123-1 to 123-3 of the SRAF may be generated. Each of the transfer patterns 123-1 to 123-3 is a resist pattern generated at a single resist height. Herein, since three transfer patterns 123-1 to 123-3 are generated, the resist patterns of the SRAF are generated at three resist heights.

The determination unit 15 of the present embodiment calculates the resist thickness at which the SRAF is not transferred, when viewed from a cross-sectional direction (film-thickness cross-sectional direction), and performs quality determination of the SRAF transfer, based on the resist thickness, regardless to the transfer position of the SRAF. The determination unit 15, for example, calculates the resist thickness that is larger between the upper layer side and the lower layer side of the transfer pattern 112.

When the SRAF is transferred like the transfer pattern 112 illustrated in FIG. 21A, the determination unit 15 calculates a thickness T1 as the resist thickness that is larger between the upper layer side and the lower layer side of the transfer pattern 112.

Also, the determination unit 15 may calculate the total resist thickness of the upper layer side and the lower layer side of the transfer pattern 112. For example, when the SRAF is transferred like the transfer pattern 112 illustrated in FIG. 21A, the determination unit 15 calculates a thickness (T1+T2) as the resist thickness.

Also, when the SRAF is transferred like the transfer patterns 123-1 to 123-3 illustrated in FIG. 21B, the determination unit 15 calculates a thickness T3 as the resist thickness that is larger between the upper layer side and the lower layer side of the transfer patterns 123-1 to 123-3.

When the calculated resist thickness is larger than a predetermined value, the determination unit 15 determines that the transfer determination of the SRAF is pass. On the other hand, when the calculated resist thickness is equal to or less than a predetermined value, the determination unit 15 determines that the transfer determination of the SRAF is fail.

Also, the determination unit 15 may perform the transfer determination of the SRAF, based on the thickness of the transfer pattern 112 itself or the thickness (total value) of the transfer patterns 123-1 to 123-3.

According to the sixth embodiment described above, since the quality determination of the SRAF is performed based on the thickness at which the SRAF is transferred, the adjustment width of the SRAF is expanded. Therefore, the lithography margin can be improved.

According to the first to sixth embodiments, the quality of the mask pattern data can be accurately determined. Also, the lithography margin of the mask pattern can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such for or modifications as would fall within the scope and spirit of the inventions.

What is claimed is:

1. A pattern data generation method comprising:
    calculating an optical image at a designated resist film thickness position, with use of a computer, when a resist on a substrate is exposed using a mask with a mask pattern, the optical image being calculated by using mask pattern data of the mask pattern;
    extracting, based on the optical image, a feature quantity related to a cross-sectional shape of a resist pattern at the resist film thickness position;
    when the resist pattern is formed using the mask pattern, determining, based on the feature quantity, whether the resist pattern becomes pattern failure; and
    when the resist pattern is determined to become the pattern failure, correcting the mask pattern data of the mask pattern used to form the resist pattern determined to become the pattern failure, such that the resist pattern does not become the pattern failure.

2. The pattern data generation method according to claim 1, wherein the resist film thickness position is a plurality of film thickness positions,
    the optical image is calculated at each of the resist film thickness positions, and
    the feature quantity is a dimension related to a cross-sectional shape of the resist pattern at each of the resist film thickness positions.

3. The pattern data generation method according to claim 2, wherein the feature quantity is a slope amount of the cross-sectional shape of the resist pattern.

4. The pattern data generation method according to claim 2, wherein the feature quantity is a dimension related to an inversely tapered shape, when the resist pattern is viewed from a cross-sectional direction.

5. The pattern data generation method according to claim 2, wherein the feature quantity is a film reduction amount in a height direction, when the resist pattern is viewed from a cross-sectional direction.

6. The pattern data generation method according to claim 5, wherein whether the resist pattern becomes the pattern failure due to the film reduction in the height direction is determined, based on a resist pattern density.

7. The pattern data generation method according to claim 2, wherein the feature quantity is a footing amount in a bottom portion, when the resist pattern is viewed from a cross-sectional direction.

8. The pattern data generation method according to claim 1, wherein the feature quantity is a dimension related to a top surface shape of the resist pattern at the resist film thickness position.

9. The pattern data generation method according to claim 1, wherein when the resist pattern is divided into a plurality of patterns in a film thickness direction, the resist film thickness position is a resist film thickness position designated among a plurality of resist film thickness positions.

10. The data pattern generation method according to claim 1, wherein the optical image is calculated in plurality in each of exposure conditions, and
    whether the resist pattern becomes the pattern failure is determined, based on the feature quantity in each of the exposure conditions.

11. The pattern data generation method according to claim 1, wherein the optical image is modulated, and the feature quantity is extracted from each modulated optical image.

12. A pattern verification method comprising:
    with use of a computer, extracting, from an optical image calculated using mask pattern data of a mask pattern, a feature quantity related to a cross-sectional shape of a resist pattern at a resist film thickness position, the optical image being an optical image at the resist film thickness position designated when a resist on a substrate is exposed using a mask with the mask pattern; and
    when the resist pattern is formed using the mask pattern, determining, based on the feature quantity, whether the resist pattern becomes pattern failure.

13. The pattern verification method according to claim 12, wherein the resist film thickness position is a plurality of film thickness positions, the optical image is calculated at each of the resist film thickness positions, and the feature quantity is a dimension related to a cross-sectional shape of the resist pattern at each of the resist film thickness positions.

14. The pattern verification method according to claim 12, wherein the feature quantity is a dimension related to a top surface shape of the resist pattern at the resist film thickness position.

15. The pattern verification method according to claim 12, wherein when the resist pattern is divided into a plurality of patterns in a film thickness direction, the resist film thickness position is a resist film thickness position designated among a plurality of resist film thickness positions.

16. The data verification method according to claim 12, wherein the optical image is calculated in plurality in each of exposure conditions, and whether the resist pattern becomes the pattern failure is determined, based on the feature quantity in each of the exposure conditions.

* * * * *